US012777810B2

(12) United States Patent
Lee et al.

(10) Patent No.: US 12,777,810 B2
(45) Date of Patent: Oct. 27, 2026

(54) DISPLAY DEVICE AND ELECTRONIC DEVICE INCLUDING THE SAME

(71) Applicant: Samsung Display Co., Ltd., Yongin-Si (KR)

(72) Inventors: Kyung Hoe Lee, Yongin-si (KR); Cheol Gon Lee, Yongin-si (KR); Mu Kyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 338 days.

(21) Appl. No.: 18/655,322

(22) Filed: May 6, 2024

(65) Prior Publication Data

US 2025/0048874 A1 Feb. 6, 2025

(30) Foreign Application Priority Data

Aug. 1, 2023 (KR) ........................ 10-2023-0100469

(51) Int. Cl.

| | |
|---|---|
| ***H10K 59/40*** | (2023.01) |
| ***G06F 3/044*** | (2006.01) |
| ***G09G 3/32*** | (2016.01) |
| ***H10K 59/122*** | (2023.01) |
| ***H10K 59/13*** | (2023.01) |

(Continued)

(52) U.S. Cl.

CPC ........... *H10K 59/40* (2023.02); *G06F 3/0446* (2019.05); *G09G 3/32* (2013.01); *H10K 59/122* (2023.02); *H10K 59/13* (2023.02); *H10K 59/131* (2023.02); *H10K 59/873* (2023.02); *G09G 2360/14* (2013.01); *G09G 2380/02* (2013.01); *H10K 2102/311* (2023.02)

(58) Field of Classification Search

CPC .............. G06F 3/0446; G09G 2360/14; G09G 2380/02; G09G 3/32; H10K 2102/311; H10K 59/122; H10K 59/13; H10K 59/131; H10K 59/40; H10K 59/873

See application file for complete search history.

(56) References Cited

U.S. PATENT DOCUMENTS 8,427,819 B1 * 4/2013 Li .......................... H05K 1/142 345/212

10,197,831 B1 * 2/2019 Street ...................... G01T 1/244

(Continued)

FOREIGN PATENT DOCUMENTS

KR 10-2025-0019767 A 2/2025

*Primary Examiner* — Shaun M Campbell

(74) *Attorney, Agent, or Firm* — Innovation Counsel LLP

(57) ABSTRACT

There are provided a display device and an electronic device. The display device comprises a substrate, a circuit layer, and an element layer. A sub-region of the substrate comprises a bending region. A display area of the substrate comprises emission areas, a non-emission area between the emission areas, and light sensing areas in portions of the non-emission area. The element layer comprises light emitting elements in the emission areas, and light sensing elements in the light sensing areas. The circuit layer comprises data bending lines disposed in the bending region and electrically connected to data lines; and read-out bending lines disposed in the bending region and electrically connected to read-out lines. The bending region comprises first wiring group areas in which two or more of the data bending lines are disposed; and second wiring group areas in which two or more of the read-out bending lines are disposed.

20 Claims, 26 Drawing Sheets

(51) Int. Cl.
*H10K 59/131* (2023.01)
*H10K 59/80* (2023.01)
*H10K 102/00* (2023.01)

(56) References Cited

U.S. PATENT DOCUMENTS

| | | | | |
|---|---|---|---|---|
| 11,669,196 | B2* | 6/2023 | Ku | G06F 3/04164 345/161 |
| 2010/0295764 | A1* | 11/2010 | Wang | G02F 1/136286 345/92 |
| 2021/0019035 | A1* | 1/2021 | Yoo | G06F 3/0443 |
| 2021/0280641 | A1* | 9/2021 | Bang | H10K 59/131 |
| 2021/0376040 | A1* | 12/2021 | Youn | H10D 86/411 |
| 2022/0058362 | A1* | 2/2022 | Lee | G06V 10/145 |
| 2023/0389389 | A1* | 11/2023 | Bang | G06F 3/0446 |
| 2024/0365640 | A1* | 10/2024 | Lee | H10K 59/873 |
| 2025/0048866 | A1 | 2/2025 | Lee et al. | |

* cited by examiner

GL GWL, GIL, GCL

DISPLAY DEVICE AND ELECTRONIC DEVICE INCLUDING THE SAME

CROSS-REFERENCE TO RELATED APPLICATION

This application claims priority to Korean Patent Application No. 10-2023-0100469 filed on Aug. 1, 2023, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and an electronic device including the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

In order to be applied to various electronic devices, the display device may additionally incorporate various input functions in addition to a function of displaying an image.

For example, the display device may incorporate a touch sensing function that senses the location of a touch on the screen based on changes in capacitance. Alternatively, the display device may incorporate a scanning function for detecting a curvature of an object in contact with a screen based on differences in the amount of light reflected from the object.

SUMMARY

The display device may include light emitting elements respectively disposed in areas corresponding to emission areas arranged in a display area where an image display function is implemented, light emitting pixel drivers respectively electrically connected to the light emitting elements, and a display driving circuit transmitting data signals of the light emitting pixel drivers through data lines.

When the display device incorporates a scanning function, the display device may further include a scanning driving circuit that receives sensing signals of light sensing elements that senses the amount of light through read-out lines.

The substrate of the display device may include a main region including a display area, and a sub-region protruding from one side of the main region. The sub-region may include a bending region that is configured to be bent, a first sub-region between the main region and the bending region, and a second sub-region overlapping the main region by the bending region having a bent shape.

The display driving circuit and the scanning driving circuit may be disposed in the second sub-region.

The second sub-region may have a limited width, so pad lines connected to the scanning driving circuit may overlap pad lines connected to the display driving circuit. Accordingly, there is a problem in that unnecessary parasitic capacitors and signal coupling defects may arise, leading to signal distortion in the pad lines connected to the scanning driving circuit. As a result, it is difficult to improve the accuracy of the scanning function.

In view of the above, aspects of the present disclosure provide a display device that can improve the accuracy of the scanning function by reducing signal distortion in the pad lines while incorporating the scanning function.

According to an aspect of the present disclosure, there is provided a display device comprises a substrate comprising a main region comprising a display area in which light emitting elements and light sensing elements are disposed and a non-display area disposed around the display area, and a sub-region protruding from one side of the main region in which a bending region configured to be bent is disposed; and a circuit layer disposed on the substrate. The circuit layer comprises light emitting pixel drivers respectively electrically connected to the light emitting elements; light sensing pixel drivers respectively electrically connected to the light sensing elements; data lines electrically connected to the light emitting pixel drivers, the data lines including data line groups each including at least two data lines; read-out lines electrically connected to the light sensing pixel drivers, the read-out lines including read-out line groups each including at least two read-out lines. Read-out lines in one read-out line group disposed in the bending region may be disposed adjacent to each other without a data line interposed between the adjacent read-out lines.

The read-out line groups and the data line groups may be arranged side by side in a first direction intersecting a direction in which the sub-region extends from the main region. The data lines and the read-out lines may extend in a second direction in the bending region. The read-out line groups may be spaced apart from the data line groups in the first direction.

The circuit layer further comprises DC power supply lines extending from the non-display area to the bending region. Each of the read-out lines overlaps at least a portion of the DC power lines in the bending region in a plan view.

The data lines, the read-out lines, and the DC power lines include the same conductive layer. Each of the read-out lines is disposed between the DC power bending lines in the bending region in a plan view.

The read-out lines are disposed on an insulating layer covering the data lines and the DC power lines.

Each of the read-out lines is disposed between the DC power lines in the bending region in a plan view.

At least one of the DC power lines is disposed between the read-out lines in the bending region in a plan view.

Separation areas disposed between the read-out lines overlap the DC power lines in the bending region in a plan view.

One of the read-out lines overlaps a separation area between two of the DC power lines, and a portion of each of the two DC power lines in the bending region in a plan view.

Each of the read-out lines further overlaps at least one DC power line disposed between the two DC power lines.

The circuit layer further comprises touch sensor lines disposed in the bending region, extending in the second direction, and respectively electrically connected to the touch sensor layer, the touch sensor lines including touch sensor line groups each including at least two touch sensor lines. The touch sensor line groups are arranged side by side with the data line groups and the read-out line groups in the first direction.

The circuit layer comprises a first semiconductor layer disposed on the substrate; a first inorganic insulating layer covering the first semiconductor layer; a first conductive layer disposed on the first inorganic insulating layer; a second inorganic insulating layer covering the first conductive layer; a second conductive layer disposed on the second inorganic insulating layer; a third inorganic insulating layer covering the second conductive layer; a second semiconductor layer disposed on the third inorganic insulating layer; a fourth inorganic insulating layer covering the second semiconductor layer; a third conductive layer disposed on the fourth inorganic insulating layer; a fifth inorganic insulating layer covering the third conductive layer; a fourth conductive layer disposed on the fifth inorganic insulating layer; a first planarization layer covering the fourth conductive layer; a fifth conductive layer disposed on the first planarization layer; a second planarization layer covering the fifth conductive layer; a sixth conductive layer disposed on the second planarization layer; and a third planarization layer covering the sixth conductive layer. The fifth conductive layer comprises the data bending lines and the DC power supply lines. The read-out bending lines are disposed in the fifth conductive layer or the sixth conductive layer.

The display device further comprises a bending hole disposed in an area corresponding to the bending region and formed through the first inorganic insulating layer, the second inorganic insulating layer, the third inorganic insulating layer, the fourth inorganic insulating layer, and the fifth inorganic insulating layer; and a bank covering the bending hole. The bank comprises a first bank layer which is the same layer as the first planarization layer and covers the bending hole; a second bank layer which is the same layer as the second planarization layer and covers the first bank layer; and a third bank layer which is the same layer as the third planarization layer and is disposed on the second bank layer. The data lines and the DC power supply lines are disposed on the first bank layer and covered with the second bank layer.

According to an aspect of the present disclosure, there is provided an electronic device comprises a display device configured to emit light for displaying an image; and a cover window and a bracket facing each other and configured to accommodate the display device. The display device comprises a substrate comprising a main region comprising a display area in which emission areas are arranged and a non-display area disposed around the display area, and a sub-region protruding from one side of the main region; a circuit layer disposed on the substrate; an element layer disposed on the circuit layer; an encapsulation layer disposed on the element layer; and a touch sensor layer disposed on the encapsulation layer. The sub-region comprises a bending region which is configured to be bent, a first sub-region disposed between one side of the bending region and the main region, and a second sub-region connected to the other side of the bending region. The display area further comprises light sensing areas disposed in portions of a non-emission area which is a separation area between the emission areas. The element layer comprises light emitting elements respectively disposed in the emission areas, and light sensing elements respectively disposed in the light sensing areas. The circuit layer comprises light emitting pixel drivers respectively electrically connected to the light emitting elements; light sensing pixel drivers respectively electrically connected to the light sensing elements; data lines disposed in the display area and electrically connected to the light emitting pixel drivers; read-out lines disposed in the display area and electrically connected to the light sensing pixel drivers; data bending lines disposed in the bending region and respectively electrically connected to the data lines; read-out bending lines disposed in the bending region and respectively electrically connected to the read-out lines; and touch sensor bending lines disposed in the bending region, extending in the second direction, and respectively electrically connected to touch sensor lines of the touch sensor layer. The bending region comprises first wiring group areas in which at least two data bending lines are disposed; second wiring group areas in which at least two read-out bending lines are disposed; and third wiring group areas in which at least two touch sensor bending lines are disposed.

The circuit layer further comprises DC power supply lines disposed in the non-display area and transmitting DC powers of different voltage levels; and DC power bending lines disposed in the bending region and respectively electrically connected to the DC power supply lines. In the second wiring group areas, two or more of the DC power bending lines are disposed. The first wiring group areas, the second wiring group areas, and the third wiring group areas are arranged side by side in a first direction intersecting a direction in which the sub-region protrudes from the main region. The data bending lines, the read-out bending lines, and the DC power bending lines extend in a second direction intersecting the first direction, disposed between the first sub-region and the second sub-region. The read-out bending lines are spaced apart from the data bending lines in the first direction. Each of the read-out bending lines overlaps at least a part of a separation area between the DC power bending lines.

The data bending lines, the read-out bending lines, and the DC power bending lines are comprised in the same conductive layer. Each of the read-out bending lines is disposed between the DC power bending lines in a plan view.

The read-out bending lines are disposed on an insulating layer covering the data bending lines and the DC power bending lines in a plan view.

Each of the read-out bending lines is disposed between the DC power bending lines.

Separation areas between the read-out bending lines overlap the DC power bending lines. One of the read-out bending lines overlaps a separation area between two of the DC power bending lines, and a part of each of the two DC power bending lines.

Each of the read-out bending lines further overlaps at least one DC power bending line disposed between the two DC power bending lines in a plan view.

The display device according to embodiments includes a substrate, a circuit layer, an element layer, an encapsulation layer, and a touch sensor layer. The substrate includes a main region and a sub-region that protrudes from one side of the main region, and the sub-region includes a bending region that is configured to be bent. The element layer includes light emitting elements respectively disposed in the emission areas of the display area and light sensing elements respectively disposed in the light sensing areas of the display area. The circuit layer includes light emitting pixel drivers respectively electrically connected to the light emitting elements, light sensing pixel drivers respectively electrically connected to the light sensing elements, data lines electrically connected to the light emitting pixel drivers, read-out lines electrically connected to the light sensing pixel drivers, data bending lines disposed in the bending region and respectively electrically connected to the data lines, and read-out bending lines disposed in the bending region and respectively electrically connected to the read-out lines. The bending region includes first wiring group areas in which at least two data bending lines are disposed, and second wiring group areas in which at least two read-out bending lines are disposed.

As such, according to embodiments, the data bending lines are arranged in the first wiring group areas of the bending region, while the read-out bending lines are arranged in the second wiring group areas, which are different from the first wiring group areas of the bending region. Accordingly, since the read-out bending lines may be spaced apart from the data bending lines, it is possible to alleviate defects in which light sensing signals of the read-out bending lines are distorted by data signals of the data bending lines.

Additionally, according to embodiments, the circuit layer may further include direct current (DC) power bending lines that are disposed in the bending region and transmit DC powers such as first power and second power. The DC power bending lines may be disposed in the second wiring group areas together with the read-out bending lines.

In this way, the light sensing signals of the read-out bending lines may be stably maintained by the DC powers, thereby reducing distortion in the light sensing signals of the read-out bending lines.

However, effects according to the embodiments of the present disclosure are not limited to those exemplified above and various other effects are incorporated herein.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
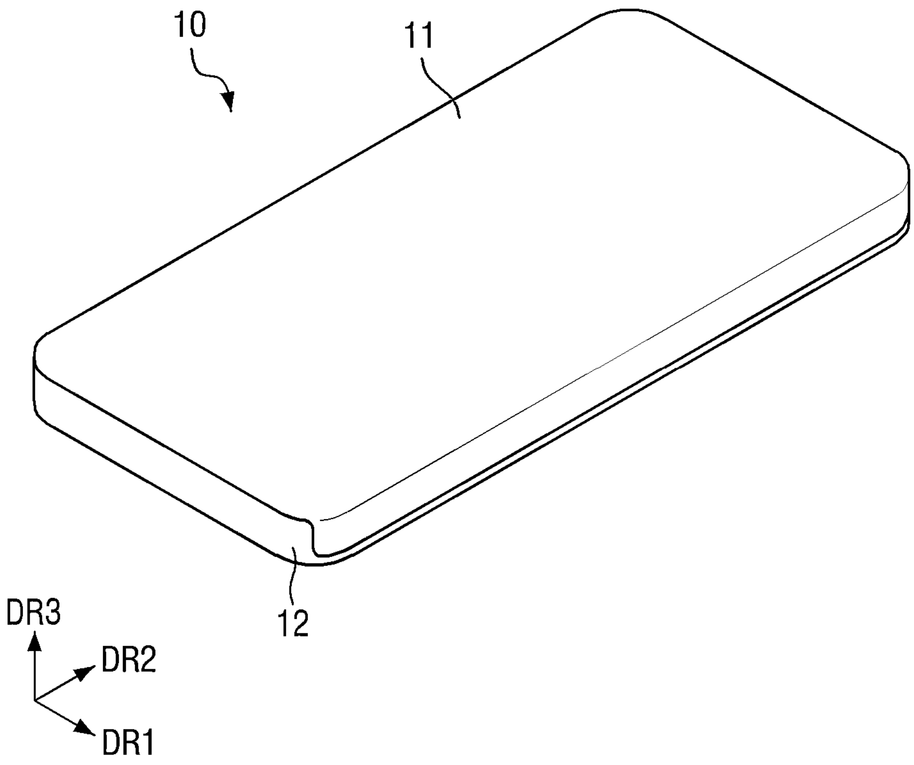
FIG. 1 is a perspective view showing an electronic device according to one embodiment.

Embodiments of the present disclosure will now be described more fully hereinafter with reference to the accompanying drawings. The embodiments may, however, be provided in different forms and should not be construed as limiting. The same reference numbers indicate the same components throughout the present disclosure. In the accompanying figures, the thickness of layers and regions may be exaggerated for clarity.

Some of the parts that are not associated with the description may not be provided in order to describe embodiments of the present disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and/or vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed “above” another device. Accordingly, the illustrative term “below” may include both the lower and upper positions. The device may also be oriented in other directions and thus the spatially relative terms may be interpreted differently depending on the orientations.

When an element is referred to as being “connected” or “coupled” to another element, the element may be “directly connected” or “directly coupled” to another element, or “electrically connected” or “electrically coupled” to another element with one or more intervening elements interposed therebetween. It will be further understood that when the terms “comprises,” “comprising,” “has,” “have,” “having,” “includes” and/or “including” are used, they may specify the presence of stated features, integers, steps, operations, elements and/or components, but do not preclude the presence or addition of other features, integers, steps, operations, elements, components, and/or any combination thereof.

It will be understood that, although the terms “first,” “second,” “third,” or the like may be used herein to describe various elements, these elements should not be limited by these terms. These terms are used to distinguish one element from another element or for the convenience of description and explanation thereof. For example, when “a first element” is discussed in the description, it may be termed “a second element” or “a third element,” and “a second element” and “a third element” may be termed in a similar manner without departing from the spirit and scope of the present disclosure herein.

The terms “about” or “approximately” as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, “about” may mean within one or more standard deviations, or within +30%, 20%, 10%, 5% of the stated value.

In the specification and the claims, the term “and/or” is intended to include any combination of the terms “and” and “or” for the purpose of its meaning and interpretation. For example, “A and/or B” may be understood to mean “A, B, or A and B.” The terms “and” and “or” may be used in the conjunctive or disjunctive sense and may be understood to be equivalent to “and/or.” In the specification and the claims, the phrase “at least one of” is intended to include the meaning of “at least one selected from the group of” for the purpose of its meaning and interpretation. For example, “at least one of A and B” may be understood to mean “A, B, or A and B.”

Unless otherwise defined or implied, all terms used herein (including technical and scientific terms) have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 2:
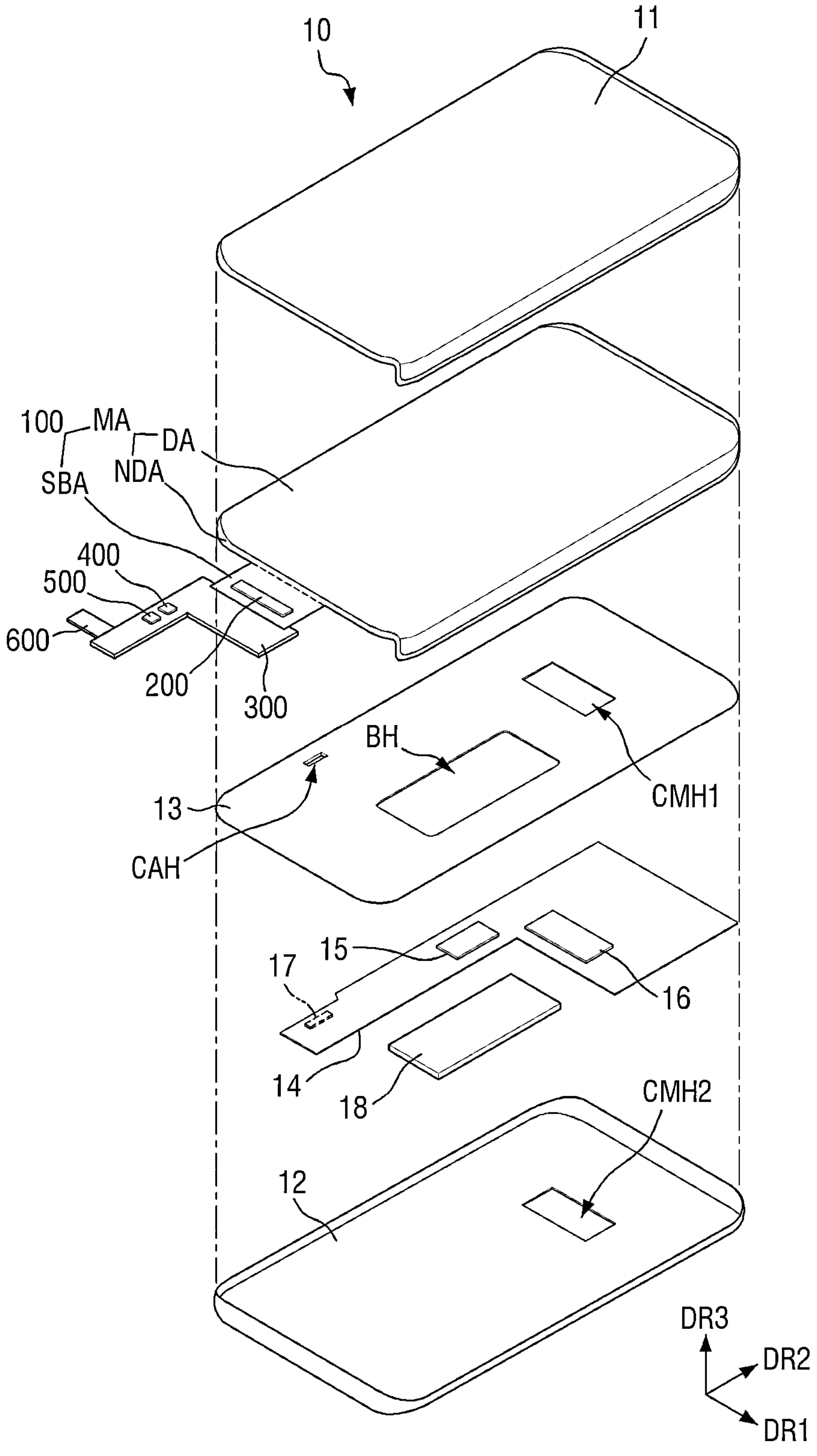
FIG. 2 is an exploded perspective view of the electronic device shown in FIG. 1.

FIG. 1 is a perspective view showing an electronic device according to one embodiment. FIG. 2 is an exploded perspective view of the electronic device shown in FIG. 1.

Referring to FIG. 1, an electronic device 10 according to one embodiment is a device having a function of displaying an image in a display area. The electronic device 10 may provide portability. For example, the electronic device 10 may be a portable electronic device such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

However, the electronic device 10 according to one embodiment is not limited to a portable electronic device, and may be a large-sized device such as a television, a laptop computer, a monitor, a billboard, and an Internet-of-Things (IoT) device.

The electronic device 10 according to one embodiment may include a cover window 11 and a lower cover 12, which are provided as a housing to protect a display device 100 (see FIG. 2).

Referring to FIG. 2, the electronic device 10 may further include the display device 100, a bracket 13, and a main circuit board 14, which are accommodated between the cover window 11 and the lower cover 12.

The display device 100 may include a main region MA including a display area DA where an image is displayed and a non-display area NDA around the display area DA, and a sub-region SBA protruding from one side of the main region MA.

The display device 100 may further include a display driving circuit 200 disposed in the sub-region SBA, a display circuit board 300 attached to one side of the sub-region SBA, a touch driving circuit 400 and a scanning driving circuit 500 mounted on the display circuit board 300, and a cable 600 extending from one side of the display circuit board 300.

In the present specification, a first direction DR1 may be a direction parallel to a short side of the electronic device 10 in a plan view, that is, a horizontal direction of the electronic device 10. A second direction DR2 may be a direction parallel to a long side of the electronic device 10 in a plan view, that is, a vertical direction of the electronic device 10. A third direction DR3 may be a thickness direction of the electronic device 10.

The electronic device 10 may have a rectangular shape in a plan view. For example, the electronic device 10 may have a rectangular shape having a short side in the first direction DR1 and a long side in the second direction DR2 in a plan view. A corner where the short side in the first direction DR1 and the long side in the second direction DR2 meet may be right-angled or rounded with a predetermined curvature. The planar shape of the electronic device 10 is not limited to the rectangular shape, and may be formed in another polygonal shape, a circular shape or an elliptical shape.

The cover window 11 may be disposed on the display device 100 to cover the top surface of the display device 100. The cover window 11 may serve to protect the top surface of the display device 100.

The cover window 11 may include a light transmitting portion that is transparent and a light blocking portion that is opaque.

The light transmitting portion may overlap the display area DA of the display device 100 in the third direction DR3, and the light blocking portion may overlap the non-display area NDA of the display device 100 in the third direction DR3.

The cover window 11 may include a top surface portion forming the top surface of the electronic device 10, a left surface portion forming the left side surface of the electronic device 10, and a right surface portion forming the right side surface of the electronic device 10. The left surface portion of the cover window 11 may extend from the left side of the top surface portion, and the right surface portion thereof may extend from the right side of the top surface portion.

Each of the top, left, and right surface portions of the cover window 11 may include the light transmitting portion and the light blocking portion.

The light transmitting portion of the cover window 11 may be disposed on most of each of the top, left, and right surface portions of the cover window 11.

The light blocking portion of the cover window 11 may be disposed at the upper edge and lower edge of the top surface portion of the cover window 11, the upper edge, left edge, and lower edge of the left surface portion of the cover window 11, and the upper edge, right edge, and lower edge of the right surface portion of the cover window 11.

The display device 100 may be disposed below the cover window 11.

That is, the cover window 11 may be disposed on the display device 100.

The display device 100 may include the main region MA and the sub-region SBA protruding from one side of the main region MA.

The main region MA may include the display area DA displaying an image and the non-display area NDA that is a peripheral area of the display area DA.

The display area DA may be disposed in most of the main region MA. The display area DA may be disposed at the center of the main region MA.

The non-display area NDA may be disposed outside the display area DA. The non-display area NDA may be an edge area of the main region MA.

The sub-region SBA may protrude from one side of the main region MA in the second direction DR2.

The length of the sub-region SBA in the first direction DR1 may be less than or equal to the length of the main region MA in the first direction DR1. The length of the sub-region SBA in the second direction DR2 may be less than the length of the main region MA in the second direction DR2, but is not limited thereto.

Since a part of the sub-region SBA is bendable, a part of the sub-region SBA may overlap the main region MA in the third direction DR3.

The display driving circuit 200 may be arranged in the sub-region SBA.

The display device 100 may include a top surface portion facing the top surface portion of the cover window 11, a left surface portion facing the left surface portion of the cover window 11, and a right surface portion facing the right surface portion of the cover window 11. The left surface portion of the display device 100 may extend from the left side of the top surface portion, and the right surface portion of the display device 100 may extend from the right side of the top surface portion.

Each of the top, left, and right surface portions of the display device 100 may include the display area DA and the non-display area NDA.

The display area DA may be disposed on most of each of the top, left, and right surface portions of the display device 100.

The non-display area NDA may be disposed at the upper edge and lower edge of the top surface portion of the display device 100, the upper edge, left edge, and lower edge of the left surface portion of the display device 100, and the upper edge, right edge, and lower edge of the right surface portion of the display device 100.

The display driving circuit 200 may be mounted on the sub-region SBA of the display device 100, and the display circuit board 300 may be attached thereto.

One end of the display circuit board 300 may be attached to pads disposed on the lower edge of the sub-region SBA of the display device 100 by using an anisotropic conductive film.

The display circuit board 300 may be a flexible printed circuit board (FPCB) which is bendable, a rigid printed circuit board (PCB) which maintains a flat shape, or a composite printed circuit board having both of the rigid printed circuit board and the flexible printed circuit board.

Based on control signals and power voltages supplied from the display circuit board 300, the display driving circuit 200 may output data signals Vdata (see FIG. 9) to light emitting pixel drivers EPD (see FIG. 8) of the display area DA via data lines DL (see FIG. 9), respectively.

The display driving circuit 200 may be provided as an integrated circuit (IC) and mounted on the sub-region SBA of the display device 100 by a chip on glass (COG) method, a chip on plastic (COP) method, or an ultrasonic method. However, this is only an example, and one embodiment is not limited thereto. For example, the display driving circuit 200 may be mounted on the display circuit board 300.

According to one embodiment, the touch driving circuit 400 and the scanning driving circuit 500 may be further mounted in the sub-region SBA of the display device 100.

Alternatively, as shown in FIG. 2, the touch driving circuit 400 and the scanning driving circuit 500 may be mounted on the display circuit board 300.

The touch driving circuit 400 may be electrically connected to a touch sensor layer 150 (see FIG. 4) of the display device 100.

The touch driving circuit 400 may apply touch driving signals to first driving lines TL1 (see FIG. 11) and second driving lines TL2 (see FIG. 11) of the touch sensor layer 150, and detect changes in the charge of capacitance based on sensing signals received from sensing lines RL (see FIG. 11) to determine whether there is user's touch or approach. The user's touch means that an object such as the user's finger or a pen comes into direct contact with the top surface of the cover window 11 disposed on the touch sensor layer. The user's approach means that the object such as the pen or the user's finger hovers over the top surface of the cover window 11. The touch driving circuit 400 may output touch data including the user's touch coordinates to the main processor 15.

The scanning driving circuit 500 may be electrically connected to light sensing pixel drivers (see FIG. 8) of the display device 100.

The scanning driving circuit 500 may periodically collect light sensing signals of light sensing elements PD (see FIG. 10) disposed in light sensing areas ODA (see FIG. 6) of the main region MA through the light sensing pixel drivers DPD. Further, based on the collected light sensing signals, the scanning driving circuit 500 may output, to the main processor 15, scanning data that includes the shape of an object in contact with a screen by detecting differences in the amount of light reflected by the object in contact with the screen.

The bracket 13 may be disposed under the display device 100.

The bracket 13 may include plastic, metal, or both plastic and metal. The bracket 13 may include a first camera hole CMH1 into which a camera 16 is inserted, a battery hole BH into which a battery 18 is disposed, and a cable hole CAH through which the cable 600 connected to the display circuit board 300 passes.

The main circuit board 14 and a battery 18 may be disposed under the bracket 13. The main circuit board 14 may be a printed circuit board or a flexible printed circuit board.

The main circuit board 14 may include a main processor 15, the camera 16, and a main connector 17. The main processor 15 may be formed as an integrated circuit.

The camera 16 may be disposed on both the top surface and the bottom surface of the main circuit board 14, the main processor 15 may be disposed on the top surface of the main circuit board 14, and the main connector 17 may be disposed on the bottom surface of the main circuit board 14.

The main processor 15 may control all functions of the electronic device 10.

For example, the main processor 15 may output digital video data to the display driving circuit 200 through the display circuit board 300 such that the display device 100 displays an image. In addition, the main processor 15 may receive touch data including user's touch coordinates from the touch driving circuit 400, determine whether or not the user has touched or approached, and then perform an operation corresponding to the user's touch input or approach input. For example, the main processor 15 may perform an operation or execute an application indicated by an icon touched by the user.

In addition, the main processor 15 may receive scanning data from the scanning driving circuit 500, and perform an operation or execute an application based on whether or not the scanning data is valid.

The main processor 15 may be an application processor formed of an integrated circuit, a central processing unit, or a system on chip.

The camera 16 may process an image frame of a still image or video obtained by an image sensor in a camera mode and output it to the main processor 15.

The cable 600 having passed through the cable hole CAH of the bracket 13 may be connected to the main connector 17. Thus, the main circuit board 14 may be electrically connected to the display circuit board 300.

The battery 18 may be disposed so as not to overlap the main circuit board 14 in the third direction DR3. The battery 18 may overlap the battery hole BH of the bracket 13 in the third direction DR3.

In addition, the main circuit board 14 may be further equipped with a mobile communication module capable of transmitting and receiving radio signals with at least one of a base station, an external terminal, or a server in a mobile communication network. The radio signal may include various types of data according to transmission and reception of a voice signal, a video call signal, or a text/multimedia message.

The lower cover 12 may be disposed below the main circuit board 14 and the battery 18. The lower cover 12 may be fastened to the bracket 13. The lower cover 12 may cover the upper side surface, lower side surface, and bottom surface of the electronic device 10. The lower cover 12 may include plastic, metal, or both plastic and metal.

The lower cover 12 may include a second camera hole CMH2 through which the bottom surface of the camera 16 is exposed. The position of the camera 16 and the positions of the first and second camera holes CMH1 and CMH2 corresponding to the camera 16 are not limited to the embodiment illustrated in FIG. 2.

Next, the display device 100 according to one embodiment will be described.

Figure 3:
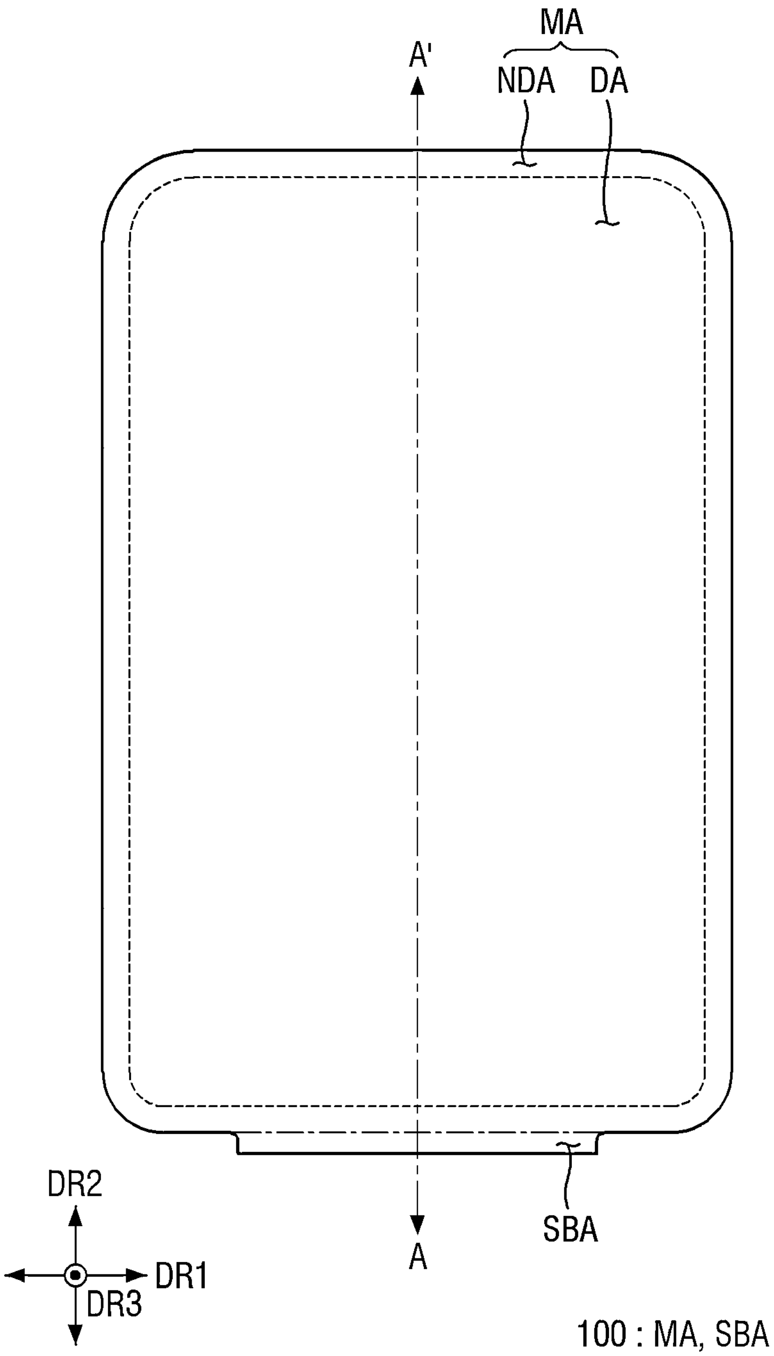
FIG. 3 is a plan view illustrating the display device of FIG. 2.
Figure 4:
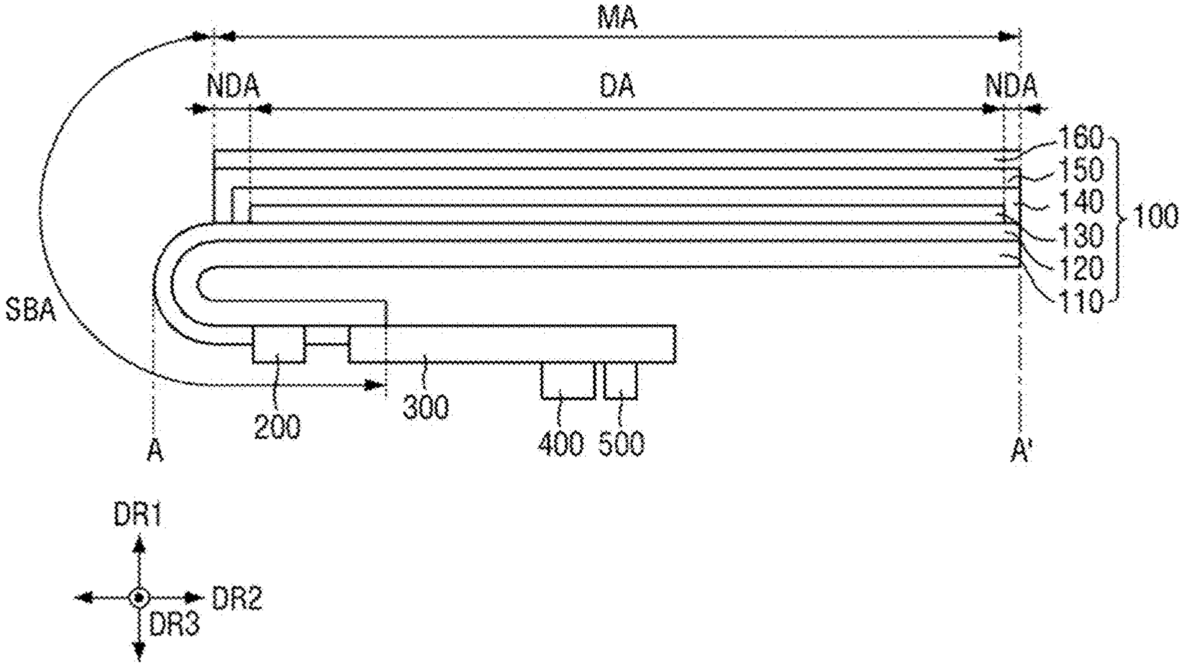
FIG. 4 is a cross-sectional view taken along line A-A' of FIG. 3.
Figure 5:
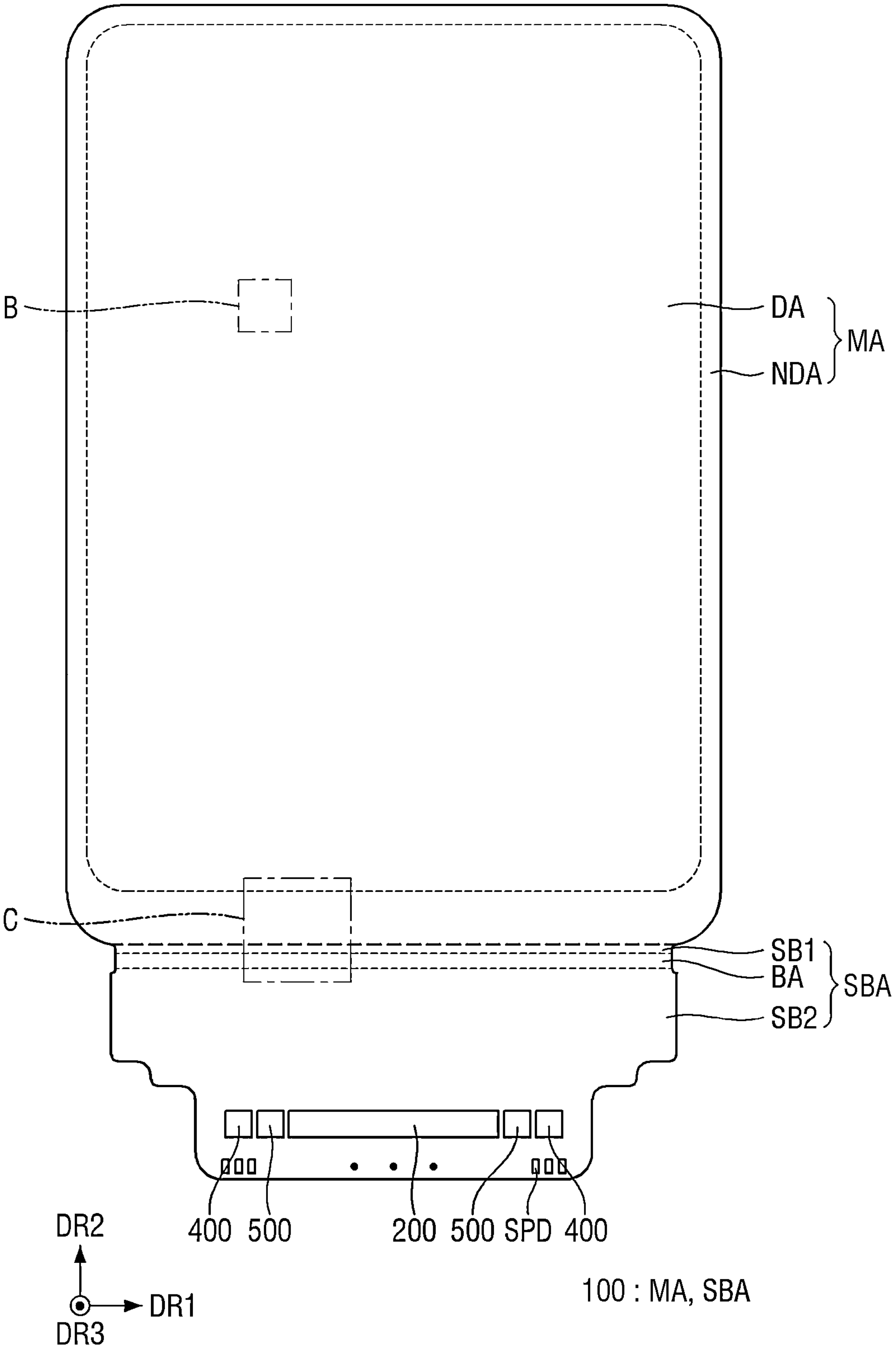
FIG. 5 is a plan view illustrating the main region and the sub-region of the display device shown in FIG. 2.
Figure 6:
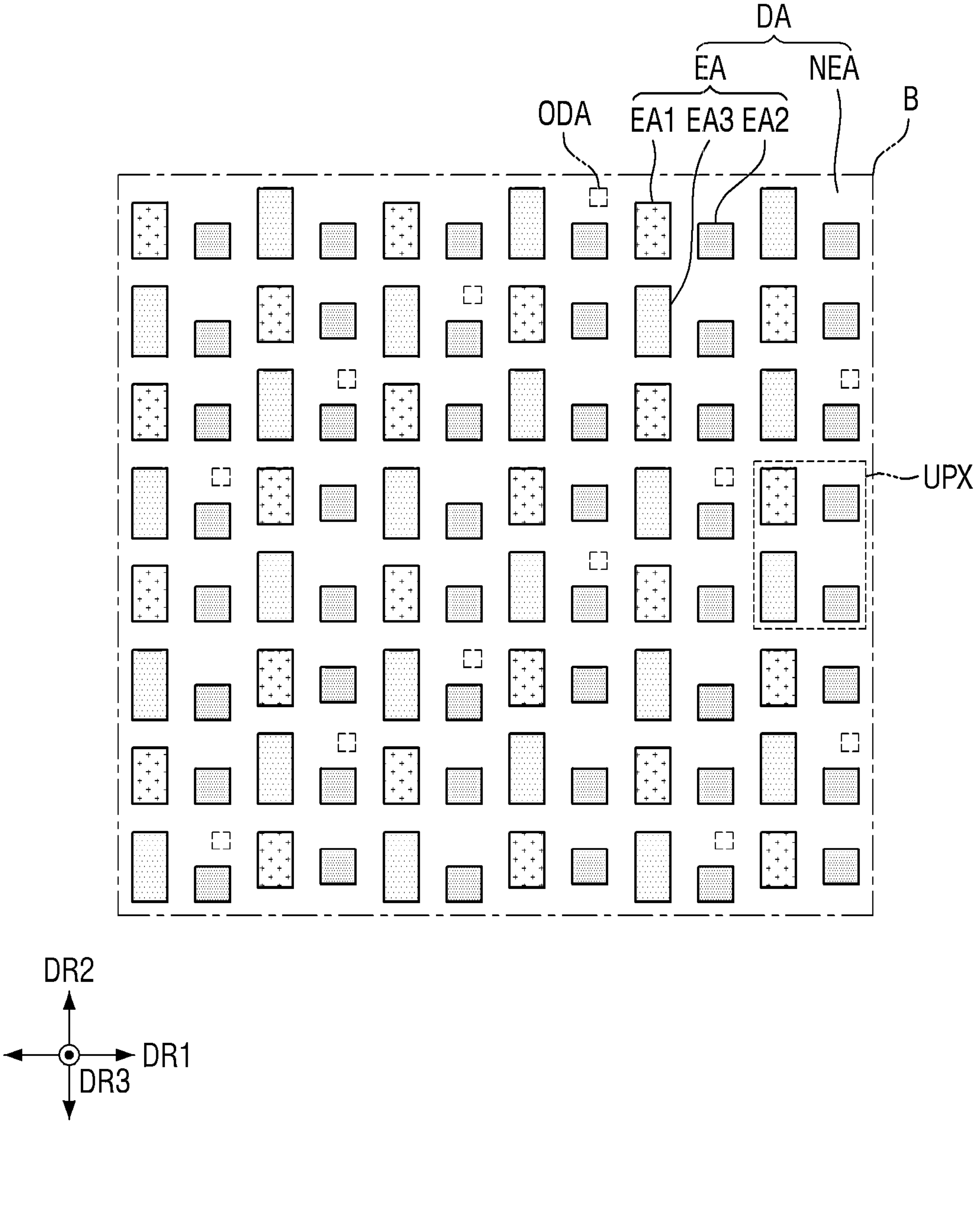
FIG. 6 is a layout diagram illustrating part B of FIG. 5.

FIG. 3 is a plan view illustrating the display device of FIG. 2. FIG. 4 is a cross-sectional view taken along line A-A' of FIG. 3. FIG. 5 is a plan view illustrating the main region and the sub-region of the display device shown in FIG. 2. FIG. 6 is a layout diagram illustrating part B of FIG. 5.

FIGS. 3 and 4 illustrate the display device 100 when the display device is bent in the sub-region SBA.

The display device 100 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). In the following description, it is assumed that the display device 100 is an organic light emitting display device. However, the present disclosure is not limited thereto, and may be applied to a display device including an organic insulating material, an organic light emitting material, and a metal material.

The display device 100 may be formed to be flat, but is not limited thereto. For example, the display device 100 may include a curved portion formed at left and right ends and having a constant curvature or a varying curvature. In addition, the display device 100 may be formed flexibly so that it can be curved, bent, folded, or rolled.

Referring to FIG. 3, at least one surface of the display device 100 includes the main region MA from which light for displaying an image is emitted.

The main region MA includes the display area DA in which emission areas EA (see FIG. 6) are arranged, and the non-display area NDA disposed around the display area DA.

The display area DA may, in a plan view, be formed in a rectangular shape having short sides in the first direction DR1 and long sides in the second direction DR2 intersecting the first direction DR1. The corner where the short side in the first direction DR1 and the long side in the second direction DR2 meet may be rounded to have a predetermined curvature or may be right-angled. The planar shape of the display area DA is not limited to the rectangular shape, and may be formed in another polygonal shape, a circular shape or an elliptical shape.

The display area DA may occupy most of the main region MA. The display area DA may be disposed at the center of the main region MA.

Referring to FIG. 4, the display device 100 further includes the sub-region SBA protruding from one side of the main region MA.

The sub-region SBA may be a region protruding from the non-display area NDA of the main region MA to one side in the second direction DR2.

Since a part of the sub-region SBA is bent, a part of the sub-region SBA may be disposed on the rear surface of the display device 100.

The display device 100 according to one embodiment includes a substrate 110 including the main region MA and the sub-region SBA, a circuit layer 120 disposed on the substrate 110, an element layer 130 disposed on the circuit layer 120, an encapsulation layer 140 disposed on the element layer 130, and the touch sensor layer 150 disposed on the encapsulation layer 140.

The display device 100 may further include a polarization layer 160 disposed on the touch sensor layer 150 in order to reduce reflection of external light.

The substrate 110 may be formed of an insulating material such as a polymer resin. For example, the substrate 110 may be formed of polyimide. The substrate 110 may be a flexible substrate which can be bent, folded or rolled.

Alternatively, the substrate 110 may be formed of an insulating material such as glass or the like.

Referring to FIG. 5, the substrate 110 includes the main region MA and the sub-region SBA.

The main region MA includes the display area DA which is disposed in the center, and the non-display area NDA which is disposed in the periphery of the display area DA.

The sub-region SBA may protrude from one side of the main region MA in the second direction DR2.

The sub-region SBA includes a bending region BA that is bent, a first sub-region SB1 disposed between one side of the bending region BA and the main region MA, and a second sub-region SB2 connected to the other side of the bending region BA.

The display driving circuit 200, the touch driving circuit 400, and the scanning driving circuit 500 may be disposed in the second sub-region SB2.

In the second direction DR2, one side of the second sub-region SB2 may be connected to the bending region BA, and on the other side of the second sub-region SB2, signal pads (SPD) connected to the display circuit board 300 may be arranged.

Referring to FIG. 6, the display area DA includes emission areas EA, a non-emission area NEA which is a separation area between the emission areas EA, and light sensing areas ODA disposed in parts of the non-emission area NEA.

Each of the emission areas EA may be an area that emits light in a wavelength band corresponding to one color of two or more different colors with a luminance corresponding to an image signal.

Each of the emission areas EA may have a rhombus planar shape or a rectangular planar shape. However, this is only an example, and the planar shape of the plurality of emission areas EA according to one embodiment is not limited to that illustrated in FIG. 6. That is, the plurality of emission areas EA may have a polygonal shape such as a rhombus shape or a hexagonal shape other than a rectangular shape, a circular shape, or an elliptical shape in a plan view.

The emission areas EA may include a first emission area EA1 emitting light of a first color having a predetermined wavelength band, a second emission area EA2 emitting light of a second color having a wavelength band lower than that of the first color, and a third emission area EA3 emitting light of a third color having a wavelength band lower than that of the second color.

For example, the first color may be red having a wavelength band of approximately 600 nm to approximately 750 nm, the second color may be green having a wavelength band of approximately 480 nm to approximately 560 nm, and the third color may be blue having a wavelength band of approximately 370 nm to approximately 460 nm. However, this is only an example, and the wavelength bands of the first color, the second color, and the third color according to one embodiment of this specification are not limited thereto.

Since the emission areas EA include the first emission area EA1, the second emission area EA2, and the third emission area EA3, each of unit pixels UPX may be provided by a combination of one or more first emission areas EA1, one or more second emission areas EA2, and one or more third emission areas EA3 adjacent to each other among the emission areas EA.

Each of the unit pixels UPX may be a unit for displaying various colors including white. That is, lights of various colors displayed by the unit pixels UPX may be implemented as a mixture of lights emitted from two or more emission areas EA included in each unit pixel UPX.

In a case where the first color of the first emission area EA1, the second color of the second emission area EA2, and the third color of the third emission area EA3 are red, green, and blue, respectively. The third emission area EA3 may have a larger width than the first emission area EA1, and the second emission area EA2 may have a smaller width than the first emission area EA1. However, this is merely an example, and the width of each of the emission areas EA is not limited to that illustrated in FIG. 6.

Further, the first emission area EA1 and the third emission area EA3 may be alternately arranged in the first direction DR1 or the second direction DR2. In addition, the second emission area EA2 may be arranged side by side in the first direction DR1 or the second direction DR2. The second emission area EA2 may be disposed between the first emission area EA1 and the third emission area EA3 in the first direction DR1.

In this case, each of the unit pixels UPX may include one first emission area EA1, one third emission area EA3 and two second emission areas EA2 which are disposed adjacent to each other. However, this is only an example, and the arrangement pattern of the emission areas EA and the components of the unit pixel UPX according to one embodiment are not limited to those illustrated in FIG. 6.

According to one embodiment, the display area DA includes the light sensing areas ODA disposed in portions of the non-emission area NEA.

For example, the light sensing areas ODA may be disposed between the second emission areas EA2 having a relatively small width in the second direction DR2. One or more emission areas EA may be disposed between the light sensing areas ODA in each of the first and second directions DR1 and DR2.

Referring again to FIG. 8, the circuit layer 120 on the substrate 110 includes light emitting pixel drivers EPD (see FIG. 8) respectively corresponding to the emission areas EA (see FIG. 6), the light sensing pixel drivers DPD (see FIG. 8) respectively corresponding to the light sensing areas ODA (see FIG. 6), the data lines DL (see FIG. 8) electrically connected to the light emitting pixel drivers EPD, and read-out lines ROL (see FIG. 8) electrically connected to the light sensing pixel drivers DPD.

The element layer 130 includes light emitting elements LE (see FIG. 9) respectively corresponding to the emission areas EA, and the light sensing elements PD (see FIG. 10) respectively corresponding to the light sensing areas ODA.

The encapsulation layer 140 may cover the element layer 130 and may extend into the non-display area NDA to be contact with the circuit layer 120. The encapsulation layer 140 may include a structure in which two or more inorganic layers and at least one organic layer are alternately stacked.

The touch sensor layer 150 may be disposed on the encapsulation layer 140 and may be disposed in an area correspond to the main region MA. The touch sensor layer 150 may include touch electrodes for sensing a touch of a person or an object.

The polarization layer 160 blocks external light reflected from the touch sensor layer 150, the encapsulation layer 140, the element layer 130, and the circuit layer 120, and the interfaces thereof, and this is to prevent the deterioration of visibility of an image due to external light reflection.

The cover window 11 of the electronic device 10 may be disposed on the polarization layer 160. The cover window 11 may be attached to the polarization layer 160 by a transparent adhesive member such as an optically clear adhesive (OCA) film or an optically clear resin (OCR).

The cover window 11 may be made of an inorganic material such as glass, or an organic material such as plastic or a polymer material.

Due to the cover window 11, the touch sensor layer 150, the encapsulation layer 140, the element layer 130, and the circuit layer 120 may be protected from electrical and physical impact on the display surface.

The display device 100 according to one embodiment may include the light sensing elements PD disposed in the light sensing areas ODA, and thus may provide a scanning function to detect the shape of an object in contact with the screen.

Figure 7:
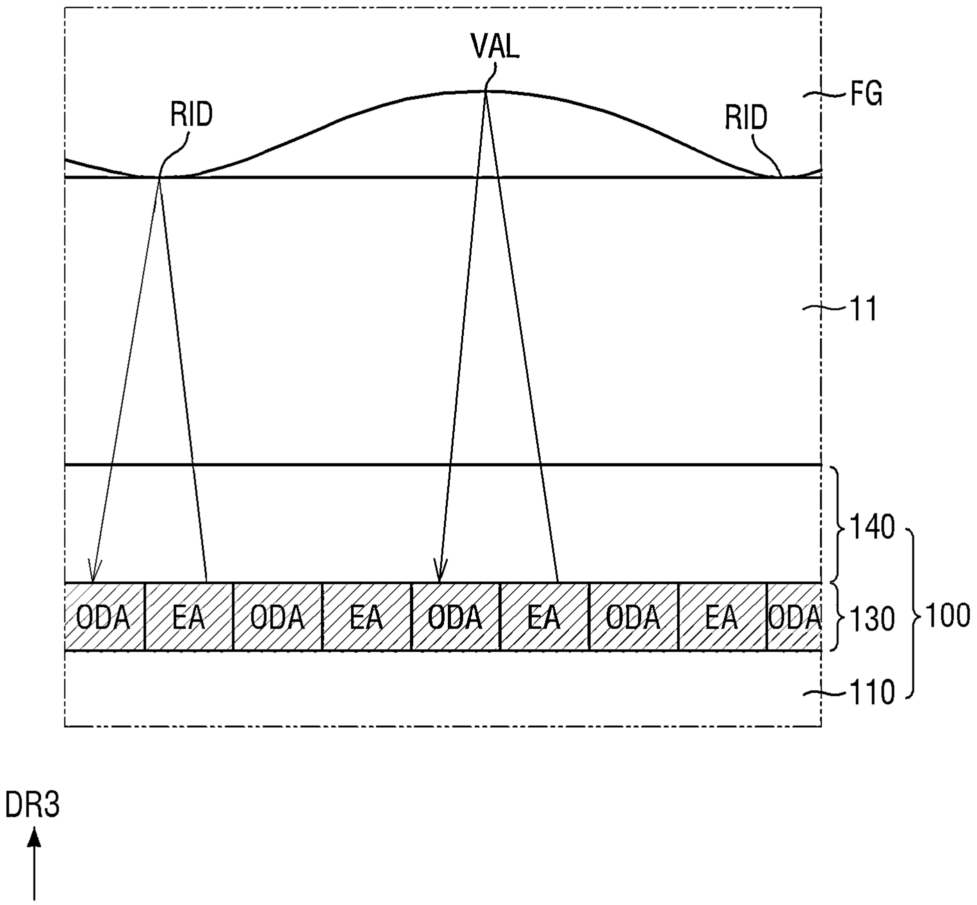
FIG. 7 is a diagram illustrating a scanning function by the light sensing areas shown in FIG. 6.

FIG. 7 is a diagram illustrating a scanning function by the light sensing areas shown in FIG. 6.

Referring to FIG. 7, the fingerprint of a user's finger FG in contact with the cover window 11 includes ridges RID and valleys VAL disposed between the ridges RID. The ridges RID in the fingerprint are in contact with the cover window 11. However, the valleys VAL in the fingerprint are spaced apart from the cover window 11. That is, the top surface of the cover window 11 facing the valleys VAL is in contact with air.

Light emitted from the emission areas EA may be reflected by the user's finger FG in contact with the cover window 11 and detected by the light sensing elements PD of the light sensing areas ODA. However, since the refractive index of the finger FG is different from that of the air, the amount of light reflected from the ridge RID may be different from the amount of light reflected from the valley VAL.

Accordingly, based on the difference in the amount of light incident on the light sensing elements PD in the light sensing areas ODA, the ridge RID and the valley VAL of the fingerprint FG may be derived, so that the fingerprint FG pattern of the finger may be detected.

Figure 8:
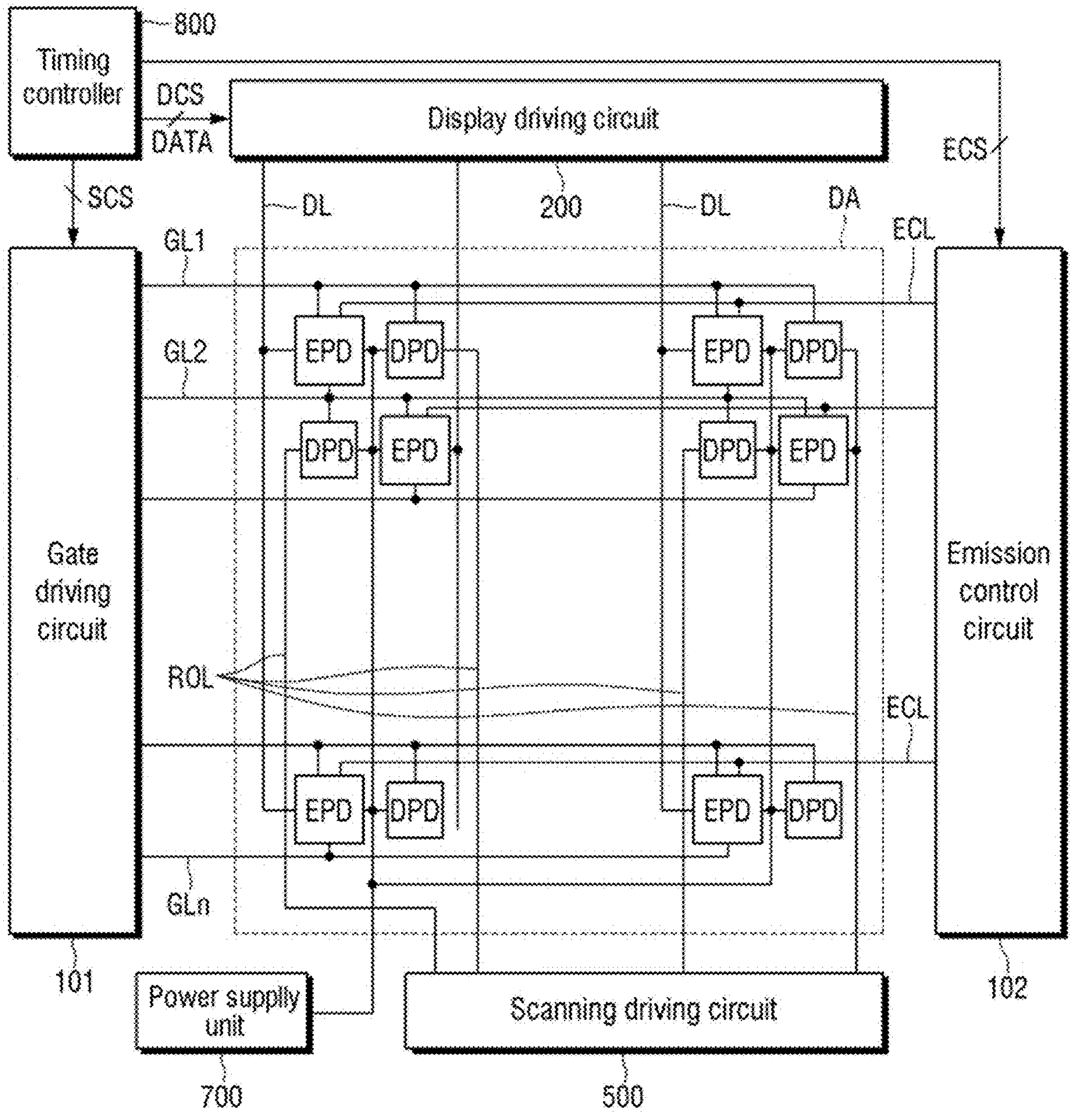
FIG. 8 is a block diagram showing a circuit layer of FIG. 4.

FIG. 8 is a block diagram showing a circuit layer of FIG. 4.

Referring to FIG. 8, the circuit layer 120 includes the light emitting pixel drivers EPD respectively disposed in areas corresponding to the emission areas EA of the display area DA, the light sensing pixel drivers DPD respectively disposed in areas corresponding to the light sensing areas ODA of the display area DA, the data lines DL disposed in the display area DA and electrically connected to the light emitting pixel drivers EPD, and the read-out lines ROL disposed in the display area DA and electrically connected to the light sensing pixel drivers DPD.

The display device 100 according to one embodiment may include the display driving circuit 200 that outputs the data signal Vdata (see FIG. 9) to each of the light emitting pixel drivers EPD, the scanning driving circuit 500 that collects light sensing signals from the light sensing pixel drivers DPD, a gate driving circuit 101 that supplies one or more gate signals to the light emitting pixel drivers EPD and the light sensing pixel drivers DPD, an emission control circuit 102 that supplies emission control signals EC (see FIG. 9) to the light emitting pixel drivers EPD, a power supply unit 700 that supplies various DC power voltages to the light emitting pixel drivers EPD and the light sensing pixel drivers DPD, and a timing controller 800 that controls a driving timing.

The timing controller 800 receives an image signal supplied from the outside of the display device 100. The timing controller 800 may output image data DATA and a data control signal DCS to the display driving circuit 200. In addition, the timing controller 800 may generate a scan control signal SCS for controlling the operation timing of the gate driving circuit 101, and an emission control driving signal ECS for controlling the operation timing of the emission control circuit 102. For example, the timing controller 800 may generate the scan control signal SCS and the emission control driving signal ECS, output the scan control signal SCS to the gate driving circuit 101 through the scan control line SCS, and output the emission control driving signal ECS to the emission control circuit 102 through the emission control driving line ECS.

The display driving circuit 200 may convert the image data DATA into analog data voltages and output them to the data lines DL.

The gate driving circuit 101 may generate gate signals in response to the scan control signal SCS and sequentially output the gate signals to gate lines GL1 to GLn.

The power supply unit 700 may supply various types of DC powers required to drive the light emitting pixel drivers EPD and the light sensing pixel drivers DPD.

For example, the DC powers provided by the power supply unit 700 may include a first power ELVDD (see FIG. 9) and a second power ELVSS (see FIG. 9) for driving the light emitting elements LE, and a first initialization voltage VINT (see FIG. 9) for initializing the light emitting pixel drivers EPD.

In addition, the DC powers provided by the power supply unit 700 may further include a reset voltage Vrst (see FIG. 10) for reset, and a second initialization voltage VAINT (see FIG. 10) for initializing the light sensing pixel drivers DPD.

The emission control circuit 102 may sequentially output the emission control signals EC (see FIG. 9) to the emission control lines ECL in response to the emission control driving signal ECS. The emission control signals EC of the emission control circuit 102 may have pulses of a first level voltage or a second level voltage. Meanwhile, the emission control circuit 102 may not be provided separately from the gate driving circuit 101 and may be incorporated into the gate driving circuit 101.

The scanning driving circuit 500 may be electrically connected to the light sensing elements PD through the read-out lines ROL and the light sensing pixel drivers DPD.

Each of the light sensing elements PD may generate a photocurrent corresponding to the amount of light incident on the light sensing element PD, and the scanning driving circuit 500 may detect the shape of a user's fingerprint based on the photocurrent of each of the light sensing elements PD.

The scanning driving circuit 500 may generate scanning data depending on the magnitude of photocurrent detected by the light sensing elements PD and transmit it to the main processor 15, and the main processor 15 may compare the scanning data with reference data and execute an application based on whether the scanning data matches the user's fingerprint.

Figure 9:
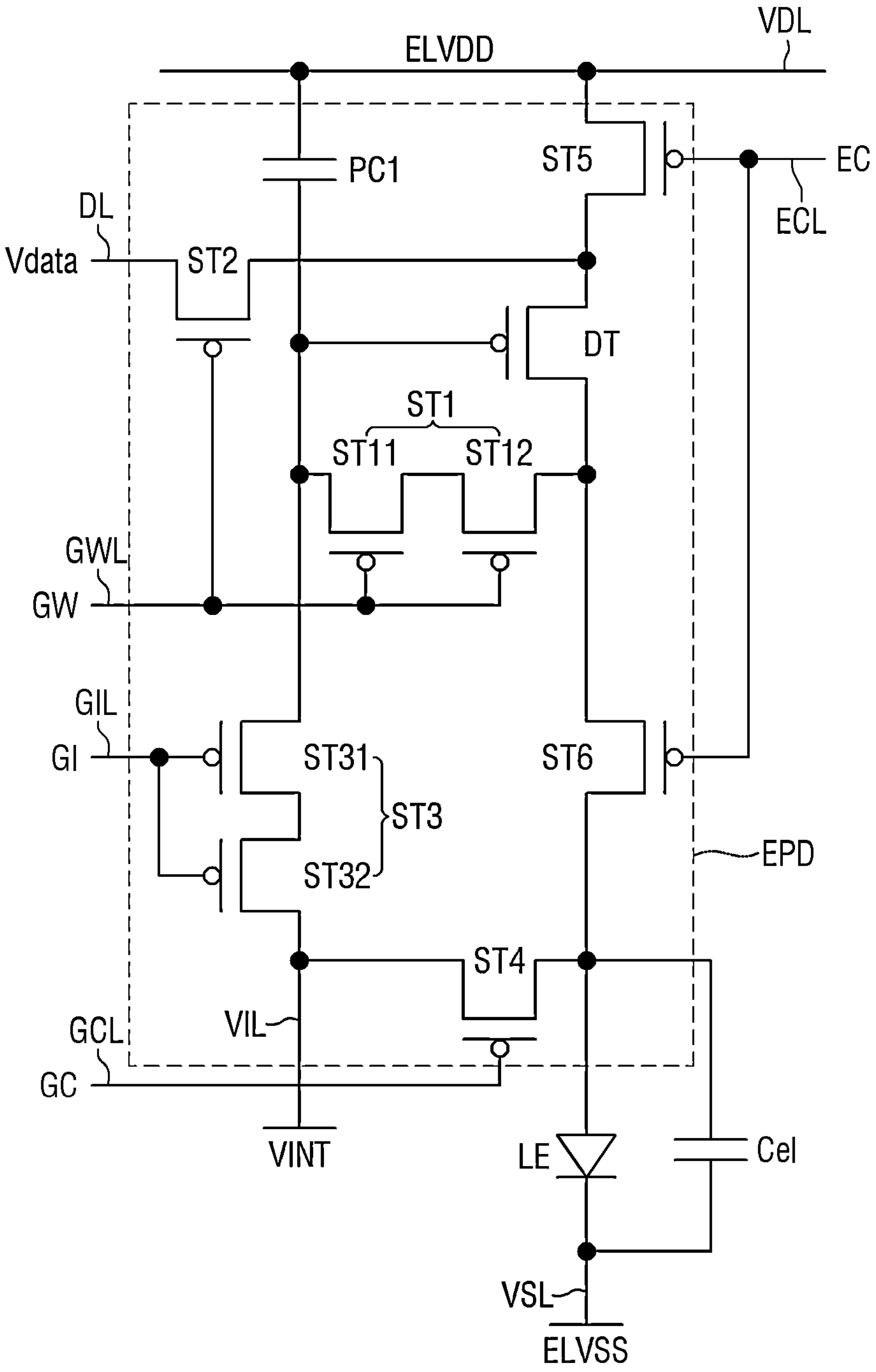
FIG. 9 is an equivalent circuit diagram of the light emitting pixel driver shown in FIG. 8.

FIG. 9 is an equivalent circuit diagram of the light emitting pixel driver shown in FIG. 8.

Referring to FIG. 9, the circuit layer 120 includes the light emitting pixel drivers EPD respectively corresponding to the emission areas EA, and a data line DL configured to transmit a data signal Vdata to the light emitting pixel drivers EPD. The light emitting pixel drivers EPD of the circuit layer 120 are electrically connected to the light emitting elements LE of the element layer 130, respectively.

The circuit layer 120 may further include a first power line VDL that transmits a first power ELVDD to the light emitting pixel drivers EPD, and an initialization voltage line VIL that transmits a first initialization voltage VINT to the light emitting pixel drivers EPD.

Further, the circuit layer 120 may further include a scan write line GWL that transmits a scan write signal GW to the light emitting pixel drivers EPD, a scan initialization line GIL that transmits a scan initialization signal GI to the light emitting pixel drivers EPD, an emission control line ECL that transmits an emission control signal EC to the light emitting pixel drivers EPD, and a gate control line GCL that transmits a gate control signal GC to the light emitting pixel drivers EPD.

Referring to FIG. 9, one light emitting pixel driver EPD among the light emitting pixel drivers EPD of the circuit layer 120 may include a driving transistor DT generating a driving current to drive the light emitting element LE electrically connected to the one light emitting pixel driver EPD. In addition, one light emitting pixel driver EPD may further include two or more transistors ST1 to ST6 electrically connected to the driving transistor DT, and the at least one capacitor PC1.

An anode electrode 131 (see FIG. 13) of the light emitting element LE may be electrically connected to the light emitting pixel driver EPD, and a cathode electrode 134 (see FIG. 13) of the light emitting element LE may be electrically connected to a second power line VSL transmitting a second driving power ELVSS that has a voltage level lower than that of the first power ELVDD.

The light emitting element LE may be an organic light emitting diode having a light emitting layer made of an organic light emitting material. Alternatively, the light emitting element LE may be an inorganic light emitting element including a light emitting layer made of an inorganic semiconductor. Alternatively, the light emitting element LE may be a quantum dot light emitting element having a quantum dot light emitting layer. Alternatively, the light emitting element LE may be a micro light emitting diode.

A parasitic capacitor Cel is connected in parallel with the light emitting element LE between the anode electrode 131 and the cathode electrode 134.

The driving transistor DT is connected in series to the light emitting element LE between the first power line VDL and the second power line VSL. That is, the first electrode (e.g., the source electrode) of the driving transistor DT may be electrically connected to the first power line VDL through a fifth transistor ST5. Further, the second electrode (e.g., the drain electrode) of the driving transistor DT may be electrically connected to the anode electrode 131 of the light emitting element LE through a sixth transistor ST6.

The first electrode of the driving transistor DT may be electrically connected to the data line DL through a second transistor ST2.

The gate electrode of the driving transistor DT may be electrically connected to the first power line VDL through a first capacitor PC1. That is, the first capacitor PC1 may be electrically connected between the gate electrode of the driving transistor DT and the first power line VDL.

Accordingly, the potential of the gate electrode of the driving transistor DT may be maintained by the first capacitor PC1.

Accordingly, when the data signal Vdata of the data line DL is transmitted to the first electrode of the driving transistor DT through the turned-on second transistor ST2, the voltage difference corresponding to the data signal Vdata and the first power ELVDD may be generated between the gate electrode of the driving transistor DT and the first electrode of the driving transistor DT.

In this case, when the voltage difference between the gate electrode of the driving transistor DT and the first electrode of the driving transistor DT, that is, the gate-source voltage difference is greater than or equal to a threshold voltage, the driving transistor DT may be turned on.

Subsequently, when the fifth transistor ST5 and the sixth transistor ST6 are turned on, the driving transistor DT may be connected in series with the light emitting element LE between the first power line VDL and the second power line VSL. Accordingly, a drain-source current corresponding to the data signal Vdata may be generated by the turned-on driving transistor DT and may be supplied as a driving current of the light emitting element LE.

Accordingly, the light emitting element LE may emit light having a luminance corresponding to the data signal Vdata.

The second transistor ST2 may be connected between the first electrode of the driving transistor DT and the data line DL.

The first transistor ST1 may be connected between the gate electrode of the driving transistor DT and the second electrode of the driving transistor DT.

The first transistor ST1 may include a plurality of sub-transistors connected in series. For example, the first transistor ST1 may include a first sub-transistor ST11 and a second sub-transistor ST12.

The first electrode of the first sub-transistor ST11 may be connected to the gate electrode of the driving transistor DT, the second electrode of the first sub-transistor ST11 may be connected to the first electrode of the second sub-transistor ST12, and the second electrode of the second sub-transistor ST12 may be connected to the second electrode of the driving transistor DT.

In this way, it is possible to prevent the potential of the gate electrode of the driving transistor DT from changing due to the leakage current caused by the first transistor ST1 that is not turned on.

The gate electrode of each of the second transistor ST2, the first sub-transistor ST11, and the second sub-transistor ST12 may be connected to the scan write line GWL.

Accordingly, when the scan write signal GW is transmitted through the scan write line GWL, the second transistor ST2, the first sub-transistor ST11, and the second sub-transistor ST12 may be turned on.

In this case, the data signal Vdata may be transmitted to the first electrode of the driving transistor DT through the turned-on second transistor ST2.

Further, the gate electrode of the driving transistor DT and the second electrode of the driving transistor DT may have the same potential through the turned-on first sub-transistor ST11 and the turned-on second sub-transistor ST12.

Accordingly, the driving transistor DT may be turned on.

The third transistor ST3 may be connected between the gate electrode of the driving transistor DT and an initialization voltage line VIL.

The third transistor ST3 may include a plurality of sub-transistors connected in series. For example, the third transistor ST3 may include a third sub-transistor ST31 and a fourth sub-transistor ST32.

The first electrode of the third sub-transistor ST31 may be connected to the gate electrode of the driving transistor DT, the second electrode of the third sub-transistor ST31 may be connected to the first electrode of the fourth sub-transistor ST32, and the second electrode of the fourth sub-transistor ST32 may be connected to the initialization voltage line VIL.

In this way, it is possible to prevent the potential of the gate electrode of the driving transistor DT from changing due to the leakage current caused by the third transistor ST3 that is not turned on.

The gate electrode of each of the third sub-transistor ST31 and the fourth sub-transistor ST32 may be connected to the scan initialization line GIL.

Accordingly, when the scan initialization signal GI is transmitted through the scan initialization line GIL, the third sub-transistor ST31 and the fourth sub-transistor ST32 are turned on and, thus, the potential of the gate electrode of the driving transistor DT may be initialized to the first initialization voltage VINT of the initialization voltage line VIL.

The fourth transistor ST4 may be connected between the anode electrode of the light emitting element LE and the initialization voltage line VIL.

The gate electrode of the fourth transistor ST4 may be connected to the gate control line GCL.

Accordingly, when the gate control signal GC is transmitted through the gate control line GCL, the fourth transistor ST4 may be turned on.

In this case, the potential of the anode electrode of the light emitting element LE may be initialized to the first initialization voltage VINT of the initialization voltage line VIL through the turned-on fourth transistor ST4.

Accordingly, it is possible to prevent the light emitting element LE from being driven by the current remained in the anode electrode.

The fifth transistor ST5 may be connected between the first electrode of the driving transistor DT and the first power line VDL.

The sixth transistor ST6 may be connected between the second electrode of the driving transistor DT and the anode electrode of the light emitting element LE.

The gate electrode of each of the fifth transistor ST5 and the sixth transistor ST6 may be connected to the emission control line ECL.

Accordingly, when the emission control signal EC is transmitted through the emission control line ECL, the fifth transistor ST5 and the sixth transistor ST6 are turned on and, thus, the drain-source current of the driving transistor DT may be supplied as the driving current of the light emitting element LE.

Although FIG. 9 illustrates a case in which the driving transistor DT and the first to sixth transistors ST1 to ST6 included in the light emitting pixel driver EPD are all P-type metal oxide semiconductor field effect transistors (MOSFET), it should be noted that the light emitting pixel driver EPD of one embodiment is not limited to that illustrated in FIG. 9. That is, at least one of the driving transistor DT and the first to sixth transistors ST1 to ST6 included in the light emitting pixel driver EPD according to one embodiment may be a N-type MOSFET.

Figure 10:
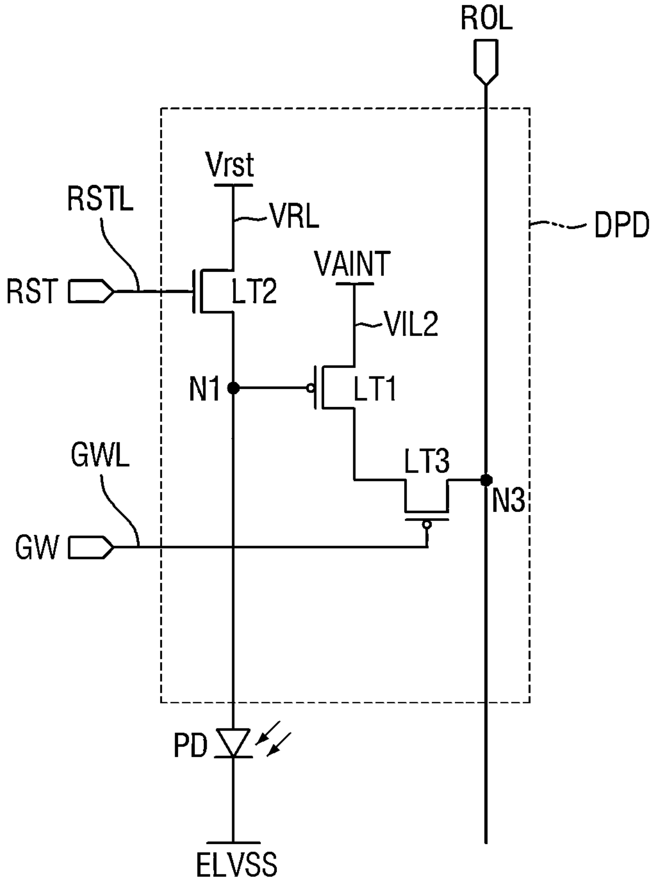
FIG. 10 is an equivalent circuit diagram of the light sensing pixel driver shown in FIG. 8.

FIG. 10 is an equivalent circuit diagram of the light sensing pixel driver shown in FIG. 8.

Referring to FIG. 10, the circuit layer 120 may further include a reset control line RSTL electrically connected to the light sensing pixel drivers DPD.

Each of the light sensing pixel drivers DPD may include two or more sensing transistors LT1, LT2, and LT3, and may be electrically connected between each light sensing element PD and the scanning driving circuit 500.

Each of the light sensing pixel drivers DPD may include first to third sensing transistors LT1, LT2, and LT3.

The light sensing element PD may be a photoelectric conversion element that converts incident light into an electrical signal by generating a photocurrent corresponding to the amount of the incident light, and outputs a light sensing signal.

The light sensing element PD may be a photodiode including a sensing anode electrode, a sensing cathode electrode, and a photoelectric conversion layer disposed between the sensing anode electrode and the sensing cathode electrode.

The light sensing element PD may be a phototransistor or an inorganic photodiode formed of a PN type or PIN type inorganic material. Alternatively, the photoelectric conversion element PD may also be an organic photodiode including an electron donating material generating donor ions and an electron accepting material generating acceptor ions.

As photocharges generated in the photoelectric conversion layer move in response to incident light, a photocurrent may be generated between the sensing anode electrode and the sensing cathode electrode.

As one example, photocharges generated in the photoelectric conversion layer by light incident on the light sensing element PD may be accumulated in a first node N1. In this case, the voltage of a first node N1 electrically connected to the sensing cathode electrode may decrease. The first sensing transistor may be turn-on when the voltage of a first node N1 decreases below a threshold voltage of the first sensing transistor. When the light sensing element PD and the read-out line ROL are connected to the first node N1 by the turn-on of the first and third sensing transistors LT1 and LT3, a sensing voltage may be detected through the read-out line ROL.

The first sensing transistor LT1 may be turned on by the voltage of the first node N1 to connect a second initialization voltage line VIL2 to the second electrode of the third sensing transistor LT3.

The first sensing transistor LT1 may be a source follower amplifier that generates a source-drain current in proportion to the amount of electric charges of the first node N1 inputted to the gate electrode thereof.

Meanwhile, the first electrode of the first sensing transistor LT1 is illustrated as being connected to the second initialization voltage line VIL2, but is not limited thereto and may be connected to the first power line VDL or the initialization voltage line VIL.

The second sensing transistor LT2 may be turned on by the reset control signal of the reset control line RSTL to connect the first node N1 to the reset voltage line VRL. Accordingly, the potential of the first node N1 may be reset.

The third sensing transistor LT3 may be turned on by the scan write signal GW of the scan write line GWL to connect the second electrode of the first sensing transistor LT1 and the read-out line ROL.

An active layer of each of the first to third sensing transistors LT1, LT2, and LT3 may include any one of polysilicon, amorphous silicon, and an oxide semiconductor.

For example, the active layer of each of the first and third sensing transistors LT1 and LT3 may be made of polysilicon, and the active layer of the second sensing transistor LT2 may be made of an oxide semiconductor. In this case, the first sensing transistor LT1 and the third sensing transistor LT3 may be formed of a P-type MOSFET, and the second sensing transistor LT2 may be formed of an N-type MOSFET.

Figure 11:
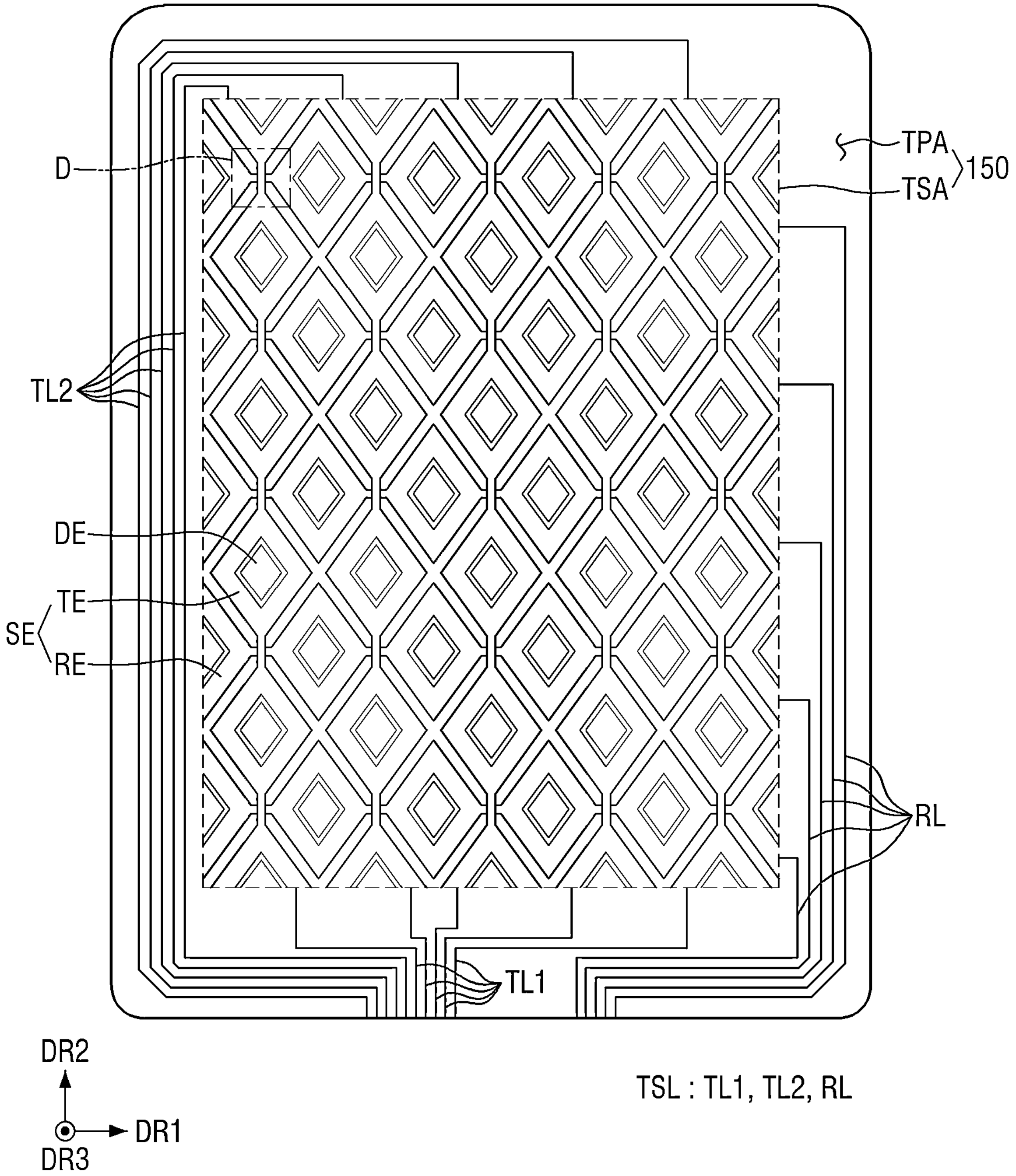
FIG. 11 is a plan view illustrating the touch sensor layer of FIG. 4.
Figure 12:
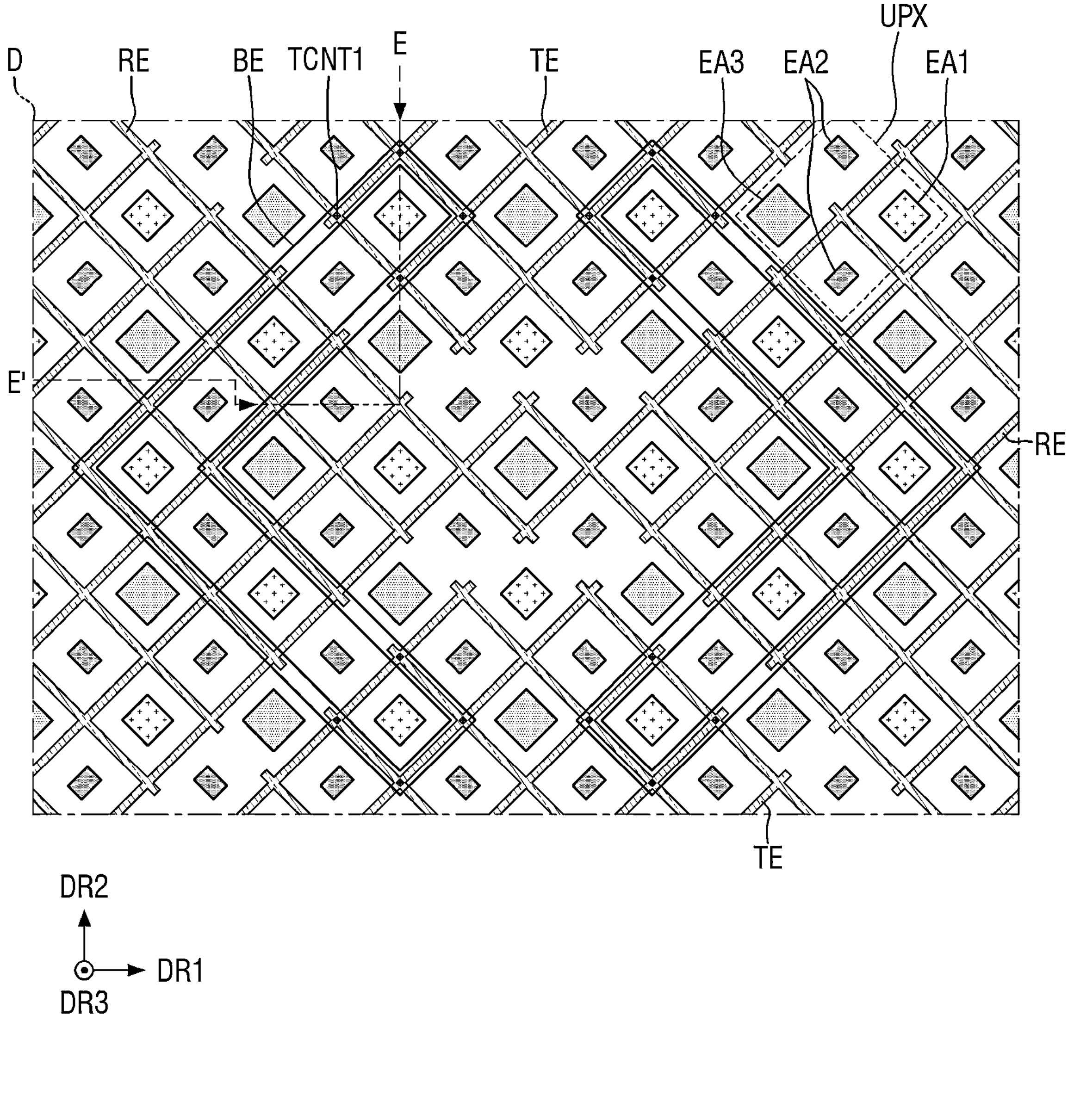
FIG. 12 is an enlarged view showing part D of FIG. 11.
Figure 13:
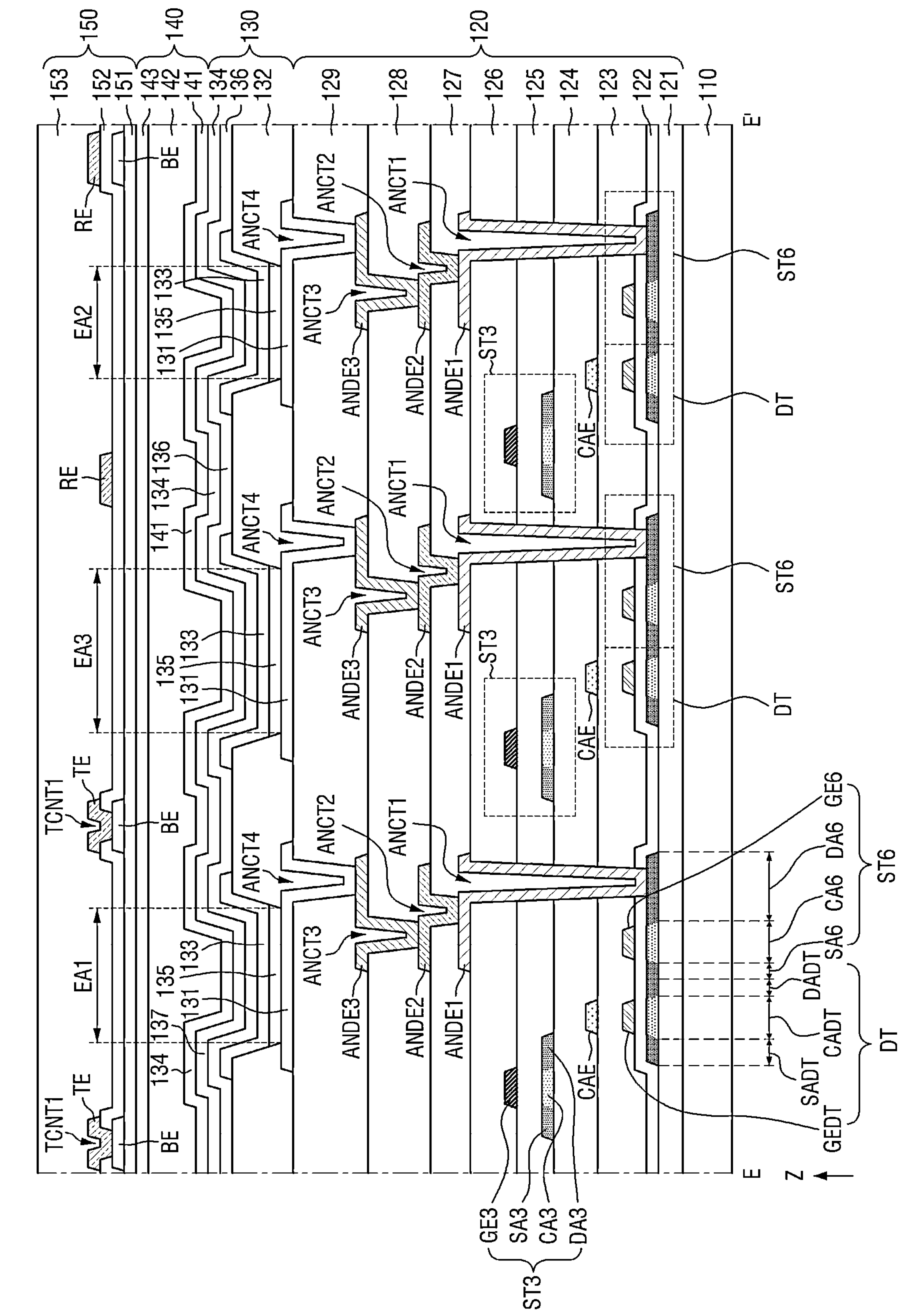
FIG. 13 is a cross-sectional view taken along line E-E' of FIG. 12.

FIG. 11 is a plan view illustrating the touch sensor layer of FIG. 4. FIG. 12 is an enlarged view showing part D of FIG. 11. FIG. 13 is a cross-sectional view taken along line E-E' of FIG. 12.

FIG. 11 shows a capacitive touch sensor layer 150. In this case, the touch driving circuit 400 may sense a touch based on a changed in capacitance. However, FIG. 11 is merely an example for easy description, and the touch sensor layer 150 according to one embodiment is not limited to that illustrated in FIG. 11.

FIG. 11 illustrates only some of the components of the touch sensor layer 150 for simplicity of description.

Referring to FIG. 11, the touch sensor layer 150 may be disposed in the main region MA. The touch sensor layer 150 may include a touch sensing area TSA for sensing a user's touch and a touch periphery area TPA around the touch sensing area TSA.

The touch sensing area TSA has a wider width than the display area DA and may be similar to the display area DA. Accordingly, the touch periphery area TPA, which is a periphery of the touch sensing area TSA, may be similar to the non-display area NDA, which is a periphery of the display area DA.

For example, the touch sensing area TSA may overlap the display area DA and the edge of the non-display area NDA in contact with the display area DA. In this case, the touch periphery area TPA may overlap the remaining part of the non-display area NDA that does not correspond to the touch sensing area TSA.

The touch sensor layer 150 may include sensor electrodes SE and dummy electrodes DE that are arranged in a matrix configuration in the touch sensing area TSA and generate mutual capacitance, and touch sensor lines TSL disposed in the touch periphery area TPA.

The sensor electrodes SE may include a driving electrode TE (touch driving electrode) to which a driving signal is applied, and a sensing electrode RE (receiving electrode) through which a voltage charged in mutual capacitance is detected.

The touch sensor lines TSL may include a first driving line TL1, a second driving line TL2, and a sensing line RL.

Each of the first driving line TL1 and the second driving line TL2 may be electrically connected to two or more driving electrodes TE extending in the second direction DR2 among the driving electrodes TE.

The first driving line TL1 may extend from one side of the touch sensing area TSA to the sub-region SBA in the second direction DR1.

The second driving line TL2 may extend, in the second direction DR2, from the other side of the touch sensing area TSA that opposes the one side to the sub-region SBA through a portion of the touch periphery area TPA that is in contact with another side of the touch sensing area TSA in the first direction DR1.

The sensing line RL may be electrically connected to two or more sensing electrodes RE extending in the first direction DR1 among the sensing electrodes RE.

The sensing electrodes RE may extend in parallel in the first direction DR1. The sensing electrodes RE disposed adjacent in the first direction DR1 may be electrically connected to each other through a protruding portion in the first direction DR1.

The driving electrodes TE may extend in parallel in the second direction DR2. The driving electrodes TE adjacent in the second direction DR2 may be electrically connected to each other through a bridge electrode BE (see FIG. 12) in the second direction DR2.

Each of the driving electrodes TE and the sensing electrodes RE may have a shape surrounding the dummy electrode DE disposed in the center thereof.

Each of the dummy electrodes DE may be spaced apart from the driving electrode TE and/or the sensing electrode RE that surrounds it. The dummy electrode DE may be maintained in a floating state.

Although FIG. 11 illustrates that each of the driving electrode TE, the sensing electrode RE, and the dummy electrode DE has a rhombic planar shape, one embodiment is not limited to that illustrated in FIG. 11. For example, the planar shape of the driving electrode TE, the sensing electrode RE, and the dummy electrode DE may be a quadrilateral shape other than a rhombus, a polygonal shape other than a quadrilateral shape, a circular shape, or an elliptical shape.

The display device 100 according to one embodiment may include the signal pads (SPD) disposed in the second sub-region SB2 and connected to the display circuit board 300.

Referring to FIG. 12, the driving electrode TE and the sensing electrode RE may be formed of the same conductive layer and may be spaced apart from each other. The bridge electrode BE may be provided as a different conductive layer from the driving electrode TE and the sensing electrode RE.

Although FIG. 12 illustrates the bridge electrode BE having a shape including at least one bend portion, the shape of the bridge electrode BE according to one embodiment is not limited to that illustrated in FIG. 12.

The driving electrodes TE adjacent in the second direction DR2 may be electrically connected to each other through two or more bridge electrodes BE. In this way, reliability of the electrical connection between the driving electrodes TE may be improved.

Although FIG. 12 illustrates that two bridge electrodes BE parallel to each other are disposed between the driving electrodes TE adjacent to each other in the second direction DR2, one embodiment is not limited to that illustrated in FIG. 12.

The bridge electrode BE may be electrically connected to the driving electrodes TE through touch contact holes TCNT1.

The driving electrode TE, the sensing electrode RE, and the bridge electrode BE may have a mesh or net structure in a plan view. The dummy electrodes DE may also have a mesh or net structure in a plan view. In this way, since the overlapping width of the driving electrode TE, the sensing electrode RE, the dummy electrode DE, and the bridge electrode BE in the emission areas EA may be reduced, a decrease in light emission efficiency due to the driving electrode TE, the sensing electrode RE, the dummy electrode DE, and the bridge electrode BE may be reduced.

Although FIG. 12 illustrates that each of the emission areas EA has a rhombic or rectangular planar shape, the planar shape of the emission areas EA according to one embodiment is not limited to that illustrated in FIG. 12. That is, each of the emission areas EA may have a planar shape such as a polygonal shape other than a quadrilateral shape, a circular shape, or an elliptical shape.

Referring to FIG. 13, the display device 100 according to one embodiment may include the substrate 110, the circuit layer 120 disposed on the substrate 110, the element layer 130 disposed on the circuit layer 120, the encapsulation layer 140 disposed on the element layer 130, and the touch sensor layer 150 disposed on the encapsulation layer 140.

The circuit layer 120 may include the light emitting pixel drivers EPD respectively disposed in areas corresponding to the emission areas EA, and the light sensing pixel drivers DPD respectively disposed in areas corresponding to the light sensing areas ODA.

Each of the light emitting pixel drivers EPD may include the driving transistor DT and two or more transistors ST1 to ST6 electrically connected to the driving transistor DT.

Each of the light sensing pixel drivers DPD may include two or more sensing transistors LT1, LT2, and LT3.

According to one embodiment, the driving transistor DT, two or more transistors ST1 to ST6, and two or more sensing transistors LT1, LT2, and LT3 may each include a semiconductor layer having a channel region CA, a source region SA, and a drain region DA, and a gate electrode overlapping the channel region CA of the semiconductor layer.

The circuit layer 120 may include a buffer layer 121 disposed on the substrate 110, a first semiconductor layer CADT, SADT, DADT, CA6, SA6, and DA6 disposed on the buffer layer 121, a first gate insulating layer 122 covering the first semiconductor layer CADT, SADT, DADT, CA6, SA6, and DA6, a first gate conductive layer GEDT and GE6 disposed on the first gate insulating layer 122, a second gate insulating layer 123 covering the first gate conductive layer GEDT and GE6, a second gate conductive layer CAE disposed on the second gate insulating layer 123, a first interlayer insulating layer 124 covering the second gate conductive layer CAE, a second semiconductor layer CA3, SA3, and DA3 disposed on the first interlayer insulating layer 124, a third gate insulating layer 125 covering the second semiconductor layer CA3, SA3, and DA3, a third gate conductive layer GE3 disposed on the third gate insulating layer 125, a second interlayer insulating layer 126 covering the third gate conductive layer GE3, a first source/drain conductive layer ADNE1 disposed on the second interlayer insulating layer 126, a first planarization layer 127 covering the first source/drain conductive layer ADNE1, a second source/drain conductive layer ANDE2 disposed on the first planarization layer 127, a second planarization layer 128 covering the second source/drain conductive layer ANDE2, a third source/drain conductive layer ANDE3 disposed on the second planarization layer 128, and a third planarization layer 129 covering the third source/drain conductive layer ANDE3.

In one example, some (e.g., the driving transistor DT) of the driving transistor DT, two or more transistors ST1 to ST6, and two or more sensing transistors LT1, LT2, and LT3 may each include a channel region CADT, a source region SADT, and a drain region DADT formed of the first semiconductor layer on the buffer layer 121, and a gate electrode GEDT disposed on the first gate insulating layer 122.

In addition, some others (e.g., the third transistor ST3) of the driving transistor DT, two or more transistors ST1 to ST6, and two or more sensing transistors LT1, LT2, and LT3 may each be provided as an N-type MOSFET including a channel region CA3, a source region SA3, and a drain region DA3 formed of the second semiconductor layer on the first interlayer insulating layer 124, and a gate electrode GE3 on the third gate insulating layer 125.

For example, among the driving transistor DT, two or more transistors ST1 to ST6, and two or more sensing transistors LT1, LT2, and LT3, the first transistor ST1 and the third transistor ST3 of the light emitting pixel driver EPD and the second sensing transistor LT2 of the light sensing pixel driver DPD may each be provided as a N-type MOSFET including the second semiconductor layer.

The buffer layer 121 is used to block oxygen or moisture that has passed through the substrate 110, and may include an inorganic insulating material.

Additionally, the buffer layer 121 may cover a light blocking layer (not shown) disposed on the substrate 110 to reduce leakage current of the first semiconductor layer caused by light.

The buffer layer 121 may be formed of multiple layers in which one or more inorganic layers of a silicon nitride layer, a silicon oxynitride layer, a silicon oxide layer, a titanium oxide layer and an aluminum oxide layer are alternately stacked.

Each of the buffer layer 121, the first gate insulating layer 122, the second gate insulating layer 123, and the first interlayer insulating layer 124 may be formed of at least one inorganic layer. For example, each of the buffer layer 121, the first gate insulating layer 122, the second gate insulating layer 123, and the interlayer insulating layer 124 may be formed of multiple layers in which one or more inorganic layers of a silicon nitride layer, a silicon oxynitride layer, a silicon oxide layer, a titanium oxide layer, and an aluminum oxide layer are alternately stacked.

Each of the first planarization layer 127 and the second planarization layer 128 may be formed of an organic layer such as acryl resin, epoxy resin, phenolic resin, polyamide resin, polyimide resin and the like.

Each of the first semiconductor layer CADT, SADT, DADT, CA6, SA6, and DA6 and the second semiconductor layer CA3, SA3, and DA3 may include one of the semiconductor materials of poly-silicon, amorphous silicon, and oxide semiconductor.

For example, the first semiconductor layer CADT, SADT, DADT, CA6, SA6, and DA6 may include a silicon semiconductor material, and the second semiconductor layer CA3, SA3, and DA3 may include an oxide semiconductor material.

In each of the driving transistor DT, two or more transistors ST1 to ST6, and two or more sensing transistors LT1, LT2, and LT3, the source region SA and the drain region DA may be connected to both sides of the channel region CA, respectively. The source region SA and the drain region DA may have higher conductivity than that of the channel region CA.

In each of the driving transistor DT, two or more transistors ST1 to ST6, and two or more sensing transistors LT1, LT2, and LT3, the gate electrode GE overlaps the channel region CA.

The first capacitor PC1 of the light emitting pixel drivers EPD may be provided as an overlapping area between a gate electrode GEDT of the driving transistor DT and a capacitor electrode CAE. The capacitor electrode CAE may be formed of a second gate conductive layer on a second gate insulating layer 123 covering the first gate conductive layer.

The anode electrode 131 of the element layer 130 may be electrically connected to the drain region DA6 of the sixth transistor ST6 through a first anode connection electrode ANDE1, a second anode connection electrode ANDE2, and a third anode connection electrode ANDE3.

The first anode connection electrode ANDE1 may be formed of the first source/drain conductive layer on the second interlayer insulating layer 126.

The first anode connection electrode ANDE1 may be electrically connected to the drain region DA6 of the sixth transistor ST6 through a first anode contact hole ANCT1 formed through the second interlayer insulating layer 126, the third gate insulating layer 125, the first interlayer insulating layer 124, the second gate insulating layer 123, and the first gate insulating layer 122.

The second anode connection electrode ANDE2 may be formed of the second source/drain conductive layer disposed on the first planarization layer 127.

The second anode connection electrode ANDE2 may be electrically connected to the first anode connection electrode ANDE1 through a second anode contact hole ANCT2 formed through the first planarization layer 127.

The third anode connection electrode ANDE3 may be formed of a third source/drain conductive layer disposed on the second planarization layer 128.

The third anode connection electrode ANDE3 may be electrically connected to the second anode connection electrode ANDE2 through a third anode contact hole ANCH3 formed through the second planarization layer 128.

The anode electrode 131 of the light emitting element LE may be disposed on the third planarization layer 129 that covers the third anode connection electrode ANDE3.

The anode electrode 131 may be electrically connected to the third anode connection electrode ANDE3 through a fourth anode contact hole ANCT4 formed through the third planarization layer 129.

The second source/drain conductive layer on the first planarization layer 127 may further include the data lines DL (see FIG. 8) that transmit the data signals Vdata to the light emitting pixel drivers EPD.

The third source/drain conductive layer on the second planarization layer 128 may include the read-out lines ROL (see FIG. 8) that output the light sensing signals of the light sensing pixel drivers DPD.

Each of the first gate conductive layer, the second gate conductive layer, the third gate conductive layer, the first source/drain conductive layer, the second source/drain conductive layer, and the third source/drain conductive layer may be formed as a single layer containing molybdenum (Mo), aluminum (Al), chromium (Cr), gold (Au), titanium (Ti), nickel (Ni), neodymium (Nd), and copper (Cu), or a multilayer at least containing two or more of molybdenum (Mo), aluminum (Al), chromium (Cr), gold (Au), titanium (Ti), nickel (Ni), neodymium (Nd), and copper (Cu).

For example, each of the first gate conductive layer, the second gate conductive layer, and the third gate conductive layer may be formed as a single layer containing molybdenum (Mo), aluminum (Al), copper (Cu), or the like. Further, each of the first source/drain conductive layer, the second source/drain conductive layer, and the third source/drain conductive layer may be formed as a triple layer of Ti/Al/Ti.

The element layer 130 may include the light emitting elements LE respectively disposed in areas corresponding to the emission areas EA, and the light sensing elements PD respectively disposed in areas corresponding to the light sensing areas ODA.

The light emitting elements LE may have a structure in which a light emitting layer is interposed between the anode and cathode electrodes facing each other. The light sensing elements PD may have a structure in which a photoelectric conversion material is interposed between the anode and cathode electrodes facing each other.

For example, each of the light emitting elements LE may include the anode electrode 131 and the cathode electrode 134 facing each other, and a light emitting layer 133 disposed therebetween.

Alternatively, each of the light emitting elements LE may further include a first common layer 135 disposed between the anode electrode 131 and the light emitting layer 133, and a second common layer 137 disposed between the light emitting layer 133 and the cathode electrode 134.

That is, the element layer 130 may include the anode electrodes 131 respectively disposed in areas corresponding to the emission areas EA, a pixel defining layer 132 disposed in areas corresponding to the non-emission area NEA and covering the edge of the anode electrode 131, the first common layers 135 respectively disposed on the anode electrodes 131, the light emitting layers 133 respectively disposed on the first common layers 135, the second common layer 136 disposed in areas corresponding to the emission areas EA and disposed on the light emitting layers 133 and the cathode electrode 134 disposed on the second common layer 136.

The anode electrode 131 may be disposed in each of the emission areas EA and may be electrically connected to one light emitting pixel driver EPD of the circuit layer 120. This anode electrode 131 may be referred to as a pixel electrode.

The anode electrode 131 may be formed of a metal material, having high reflectivity, such as a stacked structure (Ti/Al/Ti) of aluminum (Al) and titanium (Ti), a stacked structure (ITO/Al/ITO) of Al and indium tin oxide (ITO), an APC alloy, a stacked structure (ITO/APC/ITO) of an APC alloy and ITO, or the like. The APC alloy is an alloy of silver (Ag), palladium (Pd) and copper (Cu).

The first common layer 135 on the anode electrode 131 may be disposed in each of the emission areas EA. The first common layer 135 may include a hole transport layer. Alternatively, the first common layer 135 may further include a hole injection layer between the anode electrode 131 and the hole transport layer.

The light emitting layer 133 on the first common layer 135 may be disposed in each of the emission areas EA. The light emitting layer 133 of the first emission area EA1, the light emitting layer 133 of the second emission area EA2, and the light emitting layer 133 of the third emission area EA3 may include organic light emitting materials having different materials or contents.

For example, the light emitting layer 133 may be formed of an organic light emitting material that converts electron-hole pairs into light.

The organic light emitting material may include a host material and a dopant. The dopant may include a phosphorescent material or a fluorescent material.

The light emitting layer 133 of the first emission area EA1 emitting the first color may include a host material including carbazole biphenyl (CBP) or 1,3-bis(carbazol-9-yl) (mCP).

Further, the dopant of the light emitting layer 133 of the first emission area EA1 may be selected as any one or more phosphorescent materials selected among bis(1-phenylisoquinoline) acetylacetonate iridium (PIQIr(acac)), bis(1-phenylquinoline) acetylacetonate iridium (PQIr(acac)), tris(1-phenylquinoline) iridium (PQIr), and octaethylporphyrin platinum (PtOEP), or a florescent material including PBD:Eu(DBM)3(Phen) or perylene.

The light emitting layer 133 of the second emission area EA2 emitting the second color having a wavelength band lower than that of the first color may include a host material including CBP or mCP.

Further, a phosphorescent material including fac tris(2-phenylpyridine) iridium (Ir(ppy)3), or a fluorescent material including tris(8-hydroxyquinolino)aluminum (Alq3) may be selected as the dopant of the light emitting layer 133 of the second emission area EA2.

The light emitting layer 133 of the third emission area EA3 emitting the third color having a wavelength band lower than that of the second color may include a host material including CBP or mCP.

A phosphorescent material including (4,6-F2ppy)2Irpic or L2BD111 may be selected as the dopant of the light emitting layer 133 of the third emission area EA3.

The description of the organic light emitting material of the light emitting layer 133 is only an example, and the material of the light emitting layer 133 according to one embodiment is not limited to the above description.

The second common layer 136 under the cathode electrode 134 may be entirely disposed in the display area DA including the emission areas EA. The second common layer 136 may include an electron transport layer. Alternatively, the second common layer 136 may further include an electron injection layer between the cathode electrode 134 and the electron transport layer.

The cathode electrode 134 may be entirely disposed in the display area DA including the emission areas EA and may be electrically connected to the second power line VSL (see FIG. 5). The cathode electrode 134 may be referred to as a common electrode.

The cathode electrode 134 may include a transparent conductive material (TCO) such as ITO or IZO that can transmit light or a semi-transmissive conductive material such as magnesium (Mg), silver (Ag), or an alloy of Mg and Ag. When the cathode electrode 138 is made of a semi-transmissive conductive material, an improvement in light output efficiency due to a micro cavity effect may be expected.

Meanwhile, although not separately shown, the light sensing elements PD of the element layer 130 have a structure substantially similar to the light emitting elements LE, except that they include the photoelectric conversion layer instead of the light emitting layer 133, and thus redundant description will be omitted below.

The encapsulation layer 140 may be disposed on the circuit layer 120 and cover the element layer 130.

The encapsulation layer 140 may include a first encapsulation layer 141 disposed on the element layer 130 and made of an inorganic insulating material, a second encapsulation layer 142 disposed on the first encapsulation layer 141, overlapping the element layer 130, and made of an organic insulating material, and a third encapsulation layer 143 disposed on the first encapsulation layer 141, covering the second encapsulation layer 142, and made of an inorganic insulating material.

The second encapsulation layer 142 may be formed of an organic insulating material such as acryl resin, epoxy resin, phenolic resin, polyamide resin, polyimide resin and the like.

The second encapsulation layer 142 may be prepared by a process in which an organic material in a liquid state is dropped onto the first encapsulation layer 141, the dropped organic material is widely spread to cover the display area DA, and, then, the spread organic material is cured.

Accordingly, the display device 100 according to one embodiment may further include a dam (not shown) to limit the spread of the organic material of the second encapsulation layer 142.

One or more dams may be disposed in the non-display area NDA in a form that surrounds the perimeter of the display area DA.

Since the second encapsulation layer 142 is spread to the dam, the third encapsulation layer 143 may be in direct contact with the first encapsulation layer 141 between the dam and the edge of the substrate 110 in the non-display area NDA. Accordingly, an encapsulation structure formed by adhesion of inorganic materials may be provided.

Each of the first encapsulation layer 141 and the third encapsulation layer 143 may have a structure in which one or more inorganic layers of a silicon nitride layer, a silicon oxynitride layer, a silicon oxide layer, a titanium oxide layer, and an aluminum oxide layer are stacked.

The touch sensor layer 150 may include a third buffer layer 151 disposed on the encapsulation layer 140, the bridge electrode BE disposed on the third buffer layer 151, a sensor insulating layer 152 covering the bridge electrode BE, the driving electrode TE and the sensing electrode RE disposed on the sensor insulating layer 152, and an overcoat layer 153 covering the driving electrode TE and the sensing electrode RE.

Each of the third buffer layer 151 and the sensor insulating layer 152 may have a structure in which one or more inorganic layers of a silicon nitride layer, a silicon oxynitride layer, a silicon oxide layer, a titanium oxide layer, and an aluminum oxide layer are stacked.

The overcoat layer 153 may be made of an organic material that can be formed through a low-temperature process. For example, the overcoat layer 153 may be made of a negative photoresist material.

Each of the bridge electrode BE, the driving electrode TE, and the sensing electrode RE may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

Each of the dummy electrode DE disposed inside each of the driving electrode TE and the sensing electrode RE, the first driving line TL1 and the second driving line TL2 connected to the driving electrode TE, and the sensing line RL connected to the sensing electrode RE may be disposed on the same layer as the driving electrode TE and the sensing electrode RE.

The driving electrode TE may be electrically connected to the bridge electrode BE through the touch contact hole TCNT1 formed through the sensor insulating layer 152.

The driving electrode TE, the sensing electrode RE, the dummy electrode DE, the first driving line TL1 and the second driving line TL2, and the sensing line RL may have a structure including a low reflective layer. In this way, the amount of light that is incident from the outside, reflected within the display device 100, and emitted (i.e., the reflection of external light) may be reduced.

Next, the bending region BA of the sub-region SBA according to each of embodiments will be described.

Figure 14:
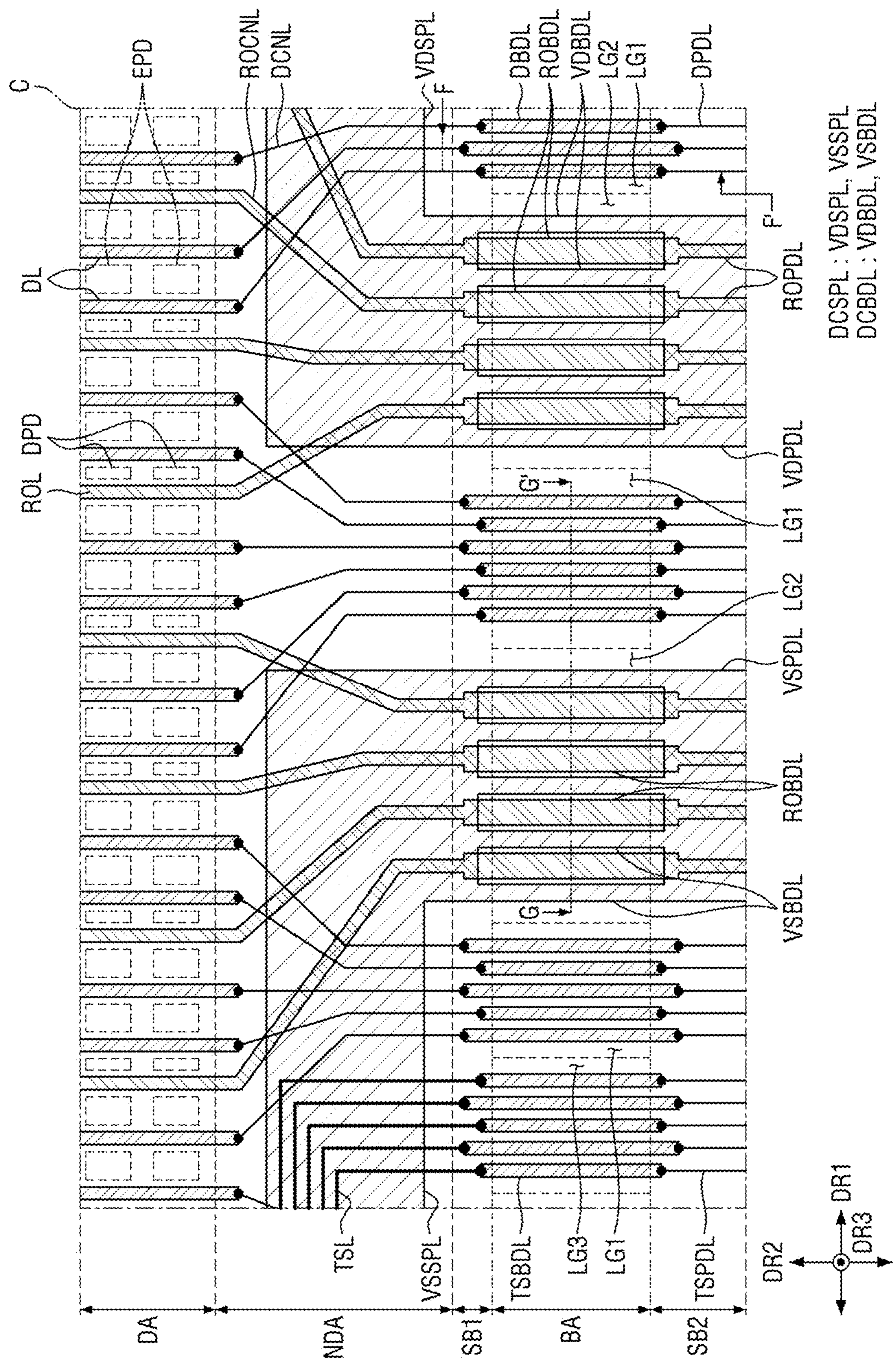
FIG. 14 is a plan view showing part C of FIG. 5 according to a first embodiment.
Figure 15:
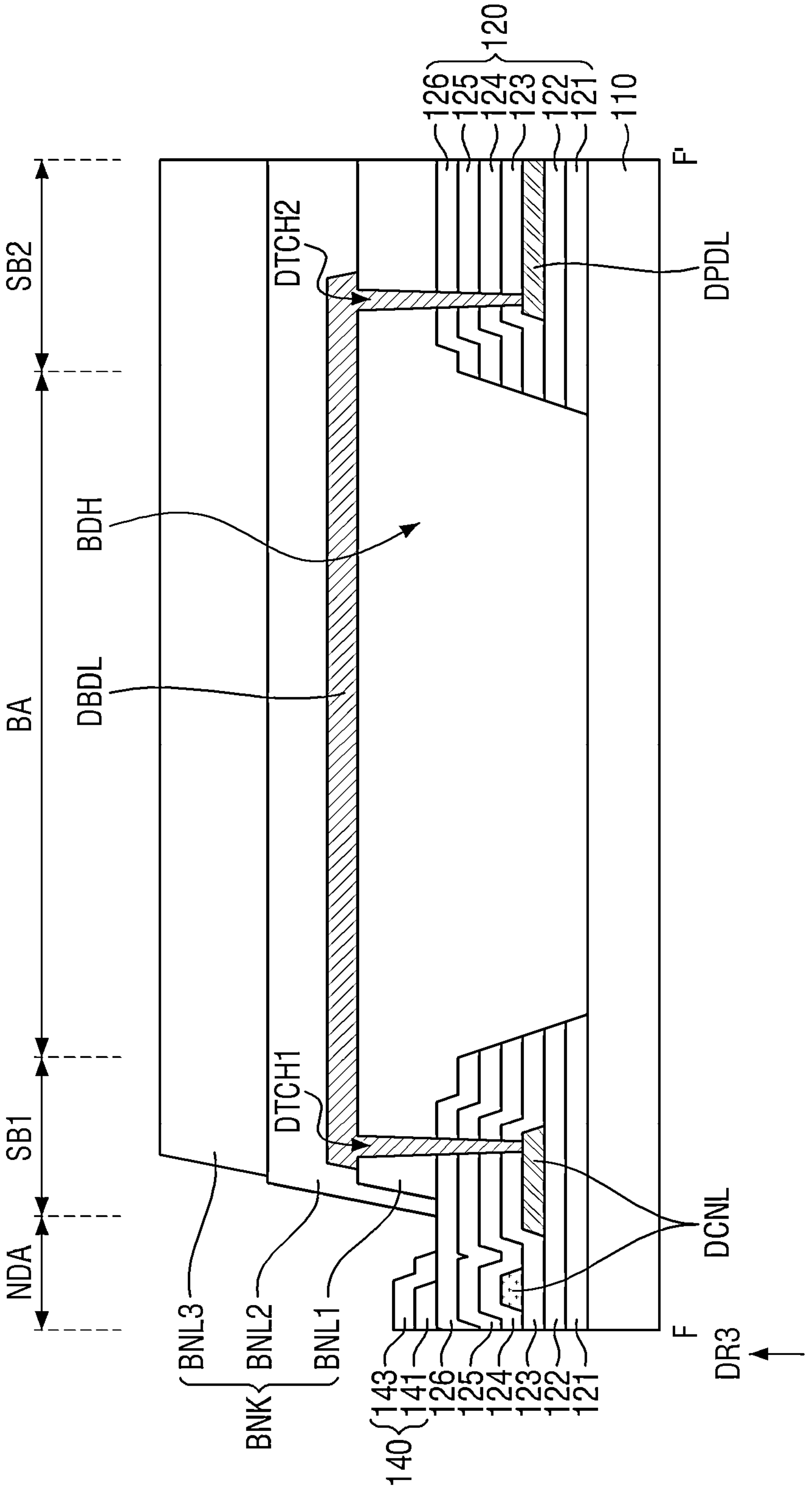
FIG. 15 is a cross-sectional view taken along line F-F' of FIG. 14.
Figure 16:
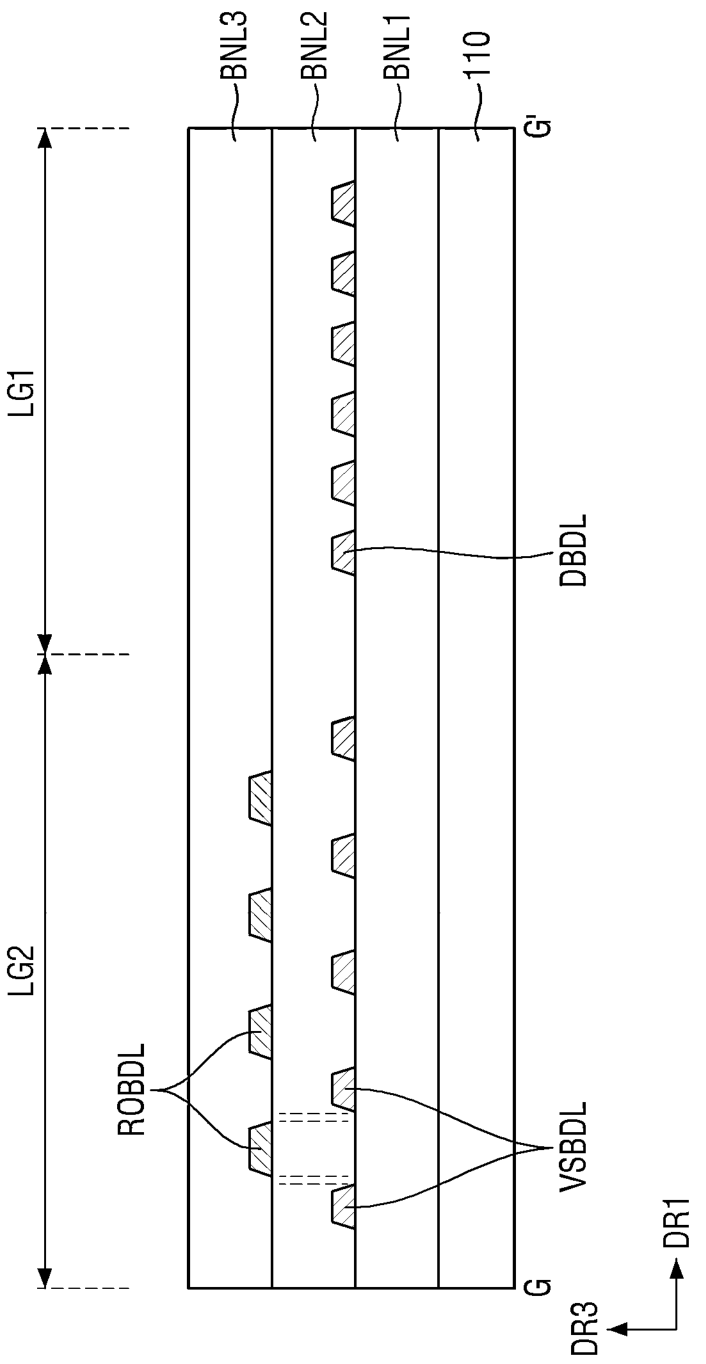
FIG. 16 is a cross-sectional view taken along line G-G' of FIG. 14 according to the first embodiment.
Figure 17:
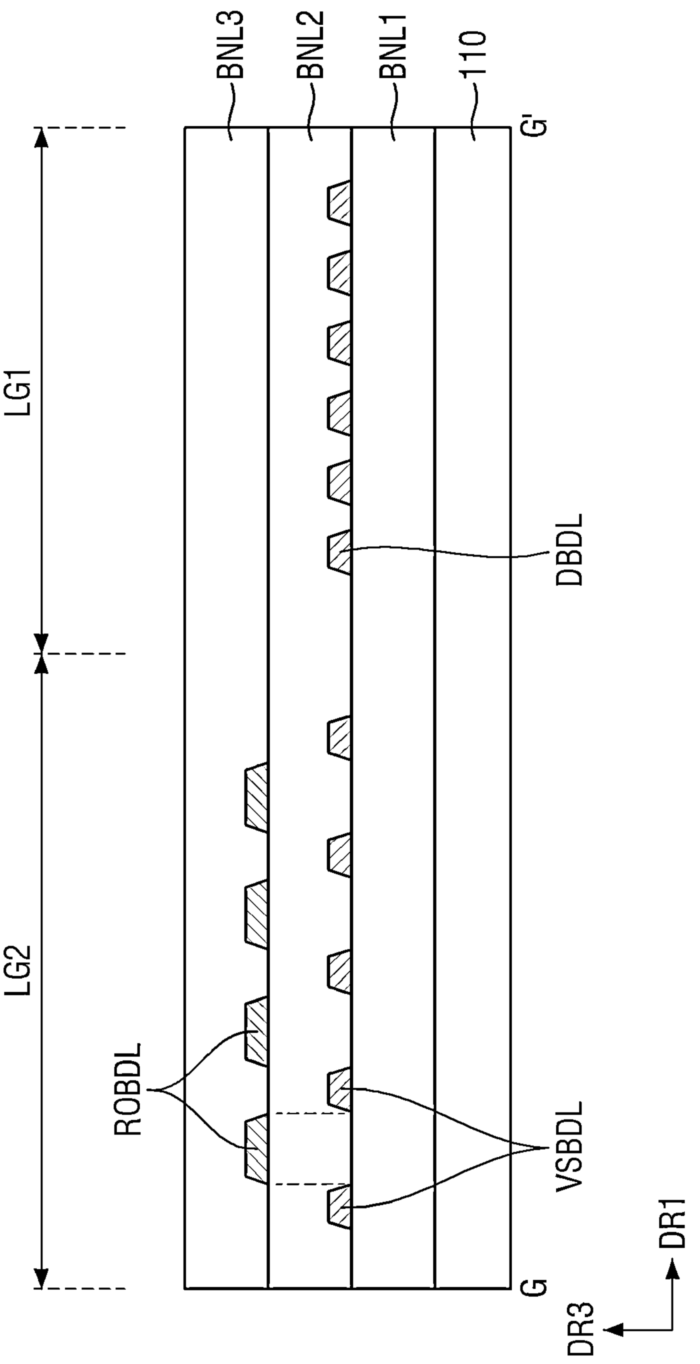
FIG. 17 is a cross-sectional view taken along line G-G' of FIG. 14 according to a second embodiment.

FIG. 14 is a plan view showing a portion C of FIG. 5 according to a first embodiment. FIG. 15 is a cross-sectional view taken along line F-F' of FIG. 14. FIG. 16 is a cross-sectional view taken along line G-G' of FIG. 14 according to the first embodiment. FIG. 17 is a cross-sectional view taken along line G-G' of FIG. 14 according to a second embodiment.

As mentioned above, the display device 100 according to one embodiment includes the substrate 110, the circuit layer 120, the element layer 130, the encapsulation layer 140, and the touch sensor layer 150.

The substrate 110 includes the main region MA and the sub-region SBA protruding from one side thereof. The main region MA includes the display area DA disposed in most of the main region MA, and the non-display area NDA disposed around the display area DA. The display area DA includes the emission areas EA, the non-emission area NEA that is a separation area between the emission areas EA, and the light sensing areas ODA disposed in parts of the non-emission area NEA.

The element layer 130 includes the light emitting elements LE respectively disposed in the emission areas EA, and the light sensing elements PD respectively disposed in the light sensing areas ODA.

Referring to FIG. 14, the circuit layer 120 of the display device 100 according to the first embodiment includes the light emitting pixel drivers EPD respectively electrically connected to the light emitting elements LE of the element layer 130, the light sensing pixel drivers DPD respectively electrically connected to the light sensing elements PD of the element layer 130, the data lines DL disposed in the display area DA and electrically connected to the light emitting pixel drivers EPD, the read-out lines ROL disposed in the display area DA and electrically connected to the light sensing pixel drivers DPD, data bending lines DBDL disposed in the bending region BA of the sub-region SBA and respectively electrically connected to the data lines DL, and read-out bending lines ROBDL disposed in the bending region BA and respectively electrically connected to the read-out lines ROL.

The bending region BA includes first wiring group areas LG1 in which two or more of the data bending lines DBDL are densely located, and second wiring group areas LG2 in which two or more of the read-out bending lines ROBDL are densely located.

In the bending region BA, the first wiring group areas LG1 and the second wiring group areas LG2 may be arranged side by side in the first direction DR1 that intersects the second direction DR2 where the sub-region SBA protrudes from the main region MA.

The data bending lines DBDL disposed in the first wiring group areas LG1 and the read-out bending lines ROBDL disposed in the second wiring group areas LG2 may extend in the second direction DR2 that intersects the first direction DR1 between the first sub-region SB1 and the second sub-region SB2.

Accordingly, in the first direction DR1, the read-out bending lines ROBDL may be spaced apart from the data bending lines DBDL. Therefore, parasitic capacitance between the read-out bending lines ROBDL and the data bending lines DBDL may be reduced.

Additionally, defects in which signals of the read-out bending lines ROBDL are coupled to signals of the data bending lines DBDL may be reduced. Accordingly, signal distortion of the read-out bending lines ROBDL may be reduced, and thus the accuracy of the scanning function may be improved.

According to the first embodiment, the circuit layer 120 may further include data connection lines DCNL disposed in the non-display area NDA and respectively electrically connecting the data lines DL to the data bending lines DBDL.

Further, the circuit layer 120 may further include data pad lines DPDL disposed in the second sub-region SB2 and electrically connecting the data bending lines DBDL to the display driving circuit 200, respectively.

Referring to FIG. 15, the display device 100 according to the first embodiment may further include a bending hole BDH that is disposed in an area corresponds to the bending region BA and is formed through inorganic layers including the buffer layer 121, the first gate insulating layer 122, the second gate insulating layer 123, the first interlayer insulating layer 124, the third gate insulating layer 125, and the second interlayer insulating layer 126 of the circuit layer 120, and a bank BNK that covers the bending hole BDH.

The bank BNK may extend from the first sub-region SB1 to the second sub-region SB2.

The bank BNK may include bank layers formed of organic layers.

In one example, the bank BNK may include a first bank layer BNL1 formed of the same layer as the first planarization layer 127, and a second bank layer BNL2 covering the first bank layer BNL1 and formed of the same layer as the second planarization layer 128.

The bank BNK may further include a third bank layer BNL3 disposed on the second bank layer BNL2 and formed of the same layer as the pixel defining layer 132.

Alternatively, the bank BNK may further include a fourth bank layer (not shown) disposed on the third bank layer BNL3 and formed of the same layer as spacers (not shown) disposed on parts of the pixel defining layer 132.

The data bending lines DBDL may be disposed on the first bank layer BNL1, which is the same layer as the first planarization layer 127. That is, the first source/drain conductive layer may include the data bending lines DBDL.

The data connection lines DCNL may be included in the first gate conductive layer on the first gate insulating layer 122 or the second gate conductive layer on the second gate insulating layer 123.

The data pad lines DPDL may be included in the first gate conductive layer on the first gate insulating layer 122 or the second gate conductive layer on the second gate insulating layer 123.

The data bending line DBDL may be electrically connected to the data connection line DCNL through a first data connection hole DTCH1, and may be electrically connected to the data pad line DPDL through a second data connection hole DTCH2.

Each of the first data connection hole DTCH1 and the second data connection hole DTCH2 may be formed through the first bank layer BNL1, the second interlayer insulating layer 126, the third gate insulating layer 125, and the first interlayer insulating layer 124. Alternatively, when the data connection line DCNL and the data pad line DPDL are included in the first gate conductive layer, each of the first data connection hole DTCH1 and the second data connection hole DTCH2 may further be formed through the second gate insulating layer 123.

As shown in FIG. 14, according to the first embodiment, the circuit layer 120 may further include DC power supply lines DCSPL disposed in the non-display area NDA and transmitting DC powers of different voltage levels, and DC power bending lines DCBDL disposed in the bending region BA, extending in the second direction DR2, and respectively electrically connected to the DC power supply lines DCSPL.

In the second wiring group areas LG2, two or more of the DC power bending lines DCBDL may be more densely located.

That is, each of the read-out bending lines ROBDL may overlap at least a part of a separation area between the DC power bending lines DCBDL.

In this way, the signals of the read-out bending lines ROBDL may be maintained more stably by the DC powers of the DC power bending lines DCBDL, thereby further reducing signal distortion in the read-out bending lines ROBDL.

According to the first embodiment, the DC powers may include the first power ELVDD and the second power ELVSS for driving the light emitting elements LE.

In this case, the DC power supply lines DCSPL may include a first power supply line VDSPL transmitting the first power ELVDD, and a second power supply line VSSPL transmitting the second power ELVSS.

In addition, the DC power bending lines DCBDL may include first power bending lines VDBDL connected to the first power supply line VDSPL, and second power bending lines VSBDL connected to the second power supply line VSSPL.

The first power bending lines VDBDL may be connected to a first power pad line VDPDL in the second sub-region SB2.

The second power bending lines VSBDL may be connected to a second power pad line VSPDL in the second sub-region SB2.

However, this is merely an example, and the DC powers according to the first embodiment may further include the first initialization voltage VINT for initializing the light emitting pixel driver EPD, and the second initialization voltage VAINT for initializing the light sensing pixel driver DPD. In this case, the DC power supply lines DCSPL may further include a first initialization voltage supply line (not shown) and a second initialization voltage supply line (not shown). Additionally, the DC power bending lines DCBDL may further include a first initialization voltage bending line (not shown) and a second initialization voltage bending line (not shown).

Referring to FIG. 16, the second power bending lines VSBDL, which are one of the DC power bending lines DCBDL, may be included in the same conductive layer as the data bending lines DBDL. That is, similarly to the data bending lines DBDL, the second power bending lines VSBDL may be included in the second source/drain conductive layer on the first bank layer BNL1.

According to the first embodiment, the read-out bending lines ROBDL may be disposed on an insulating layer, i.e., the second bank layer BNL2, covering the data bending lines DBDL and the DC power bending lines DCBDL (e.g., VSBDL).

While the data bending lines DBDL are disposed in the first wiring group areas LG1, the read-out bending lines ROBDL and the DC power bending lines DCBDL (e.g., VSBDL) may be disposed together in the second wiring group areas LG2 that are disposed side by side with the first wiring group areas LG1 in the first direction DR1.

In this way, the read-out bending lines ROBDL may be spaced apart from the data bending lines DBDL, which can reduce defects in which the light sensing signals of the readout bending lines ROBDL are distorted by the data signals of the data bending lines DBDL.

According to the first embodiment, each of the read-out bending lines ROBDL may be disposed between the DC power bending lines DCBDL (e.g., VSBDL). Additionally, at least one of the DC power bending lines DCBDL (e.g., VSBDL) may be disposed between the read-out bending lines ROBDL.

According to the first embodiment, each of the read-out bending lines ROBDL may be spaced apart from the DC power bending lines DCBDL (e.g., VSBDL) in the first direction DR1.

In this way, defects in which the signals of the read-out bending lines ROBDL interfere with the read-out bending line ROBLD may be reduced due to DC power of the DC power bend lines DCBDL (e.g., VSBDL). Consequently, the accuracy of the scanning function may be improved.

Alternatively, as shown in FIG. 17, according to the second embodiment, each of the read-out bending lines ROBDL may entirely overlap the separation area between the DC power bending lines DCBDL (e.g., VSBDL). That is, the width of each of the read-out bending lines ROBDL in the first direction DR1 may be equal to the width of the separation area between the DC power bending lines DCBDL (e.g., VSBDL).

In this way, the light sensing signals of the read-out bending lines ROBDL may be maintained more stably by the DC powers, so the accuracy of the scanning function may be further improved.

Meanwhile, as shown in FIG. 14, according to the first embodiment, the circuit layer 120 may further include touch sensor bending lines TSBDL disposed in the bending region BA, extending in the second direction DR2, and respectively electrically connected to the touch sensor lines TSL of the touch sensor layer 150.

The touch sensor bending lines TSBDL may be respectively electrically connected to touch sensor pad lines TSPDL in the second sub-region SB2.

The bending region BA may further include third wiring group areas LG3 in which two or more of the touch sensor bending lines TSBDL are densely located.

The third wiring group areas LG3 may be arranged side by side with the first wiring group areas LG1 and the second wiring group areas LG2 in the first direction DR1.

Figure 18:
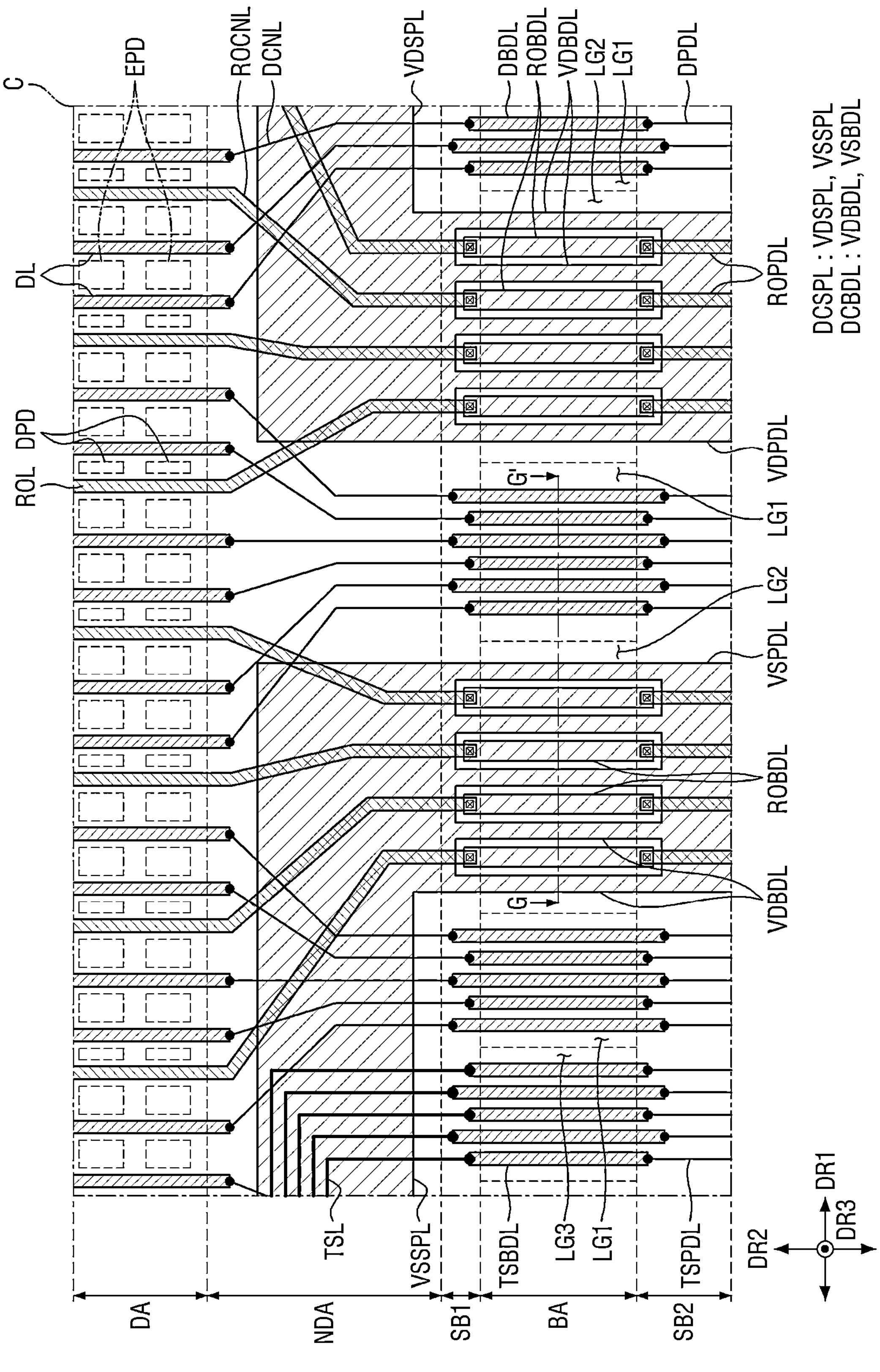
FIG. 18 is a plan view showing part C of FIG. 5 according to a third embodiment.
Figure 19:
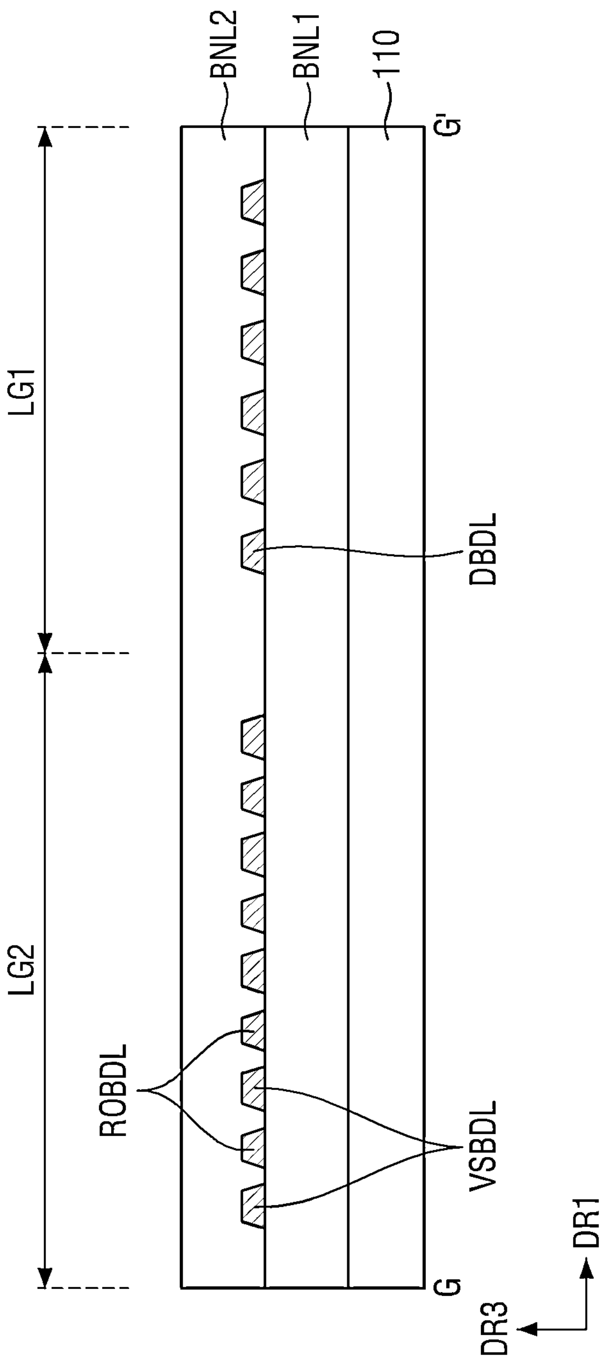
FIG. 19 is a cross-sectional view taken along line G-G' of FIG. 18.

FIG. 18 is a plan view showing part C of FIG. 5 according to a third embodiment. FIG. 19 is a cross-sectional view taken along line G-G' of FIG. 18.

Referring to FIGS. 18 and 19, the display device 100 according to the third embodiment is substantially the same as that of the first embodiment shown in FIGS. 14, 15, and 16, except that the read-out bending lines ROBDL are included in the same layer as the DC power bending lines DCBDL (e.g., VSBDL), and thus redundant description will be omitted below.

According to the third embodiment, similar to the data bending lines DBDL and the DC power bending lines DCBDL (e.g., VSBDL), the read-out bending lines ROBDL may be included in the second source/drain conductive layer on the first bank layer BNL1.

This third embodiment may be easily applied to the circuit layer 120 having a structure excluding the third source/drain conductive layer and the third planarization layer 129.

Figure 20:
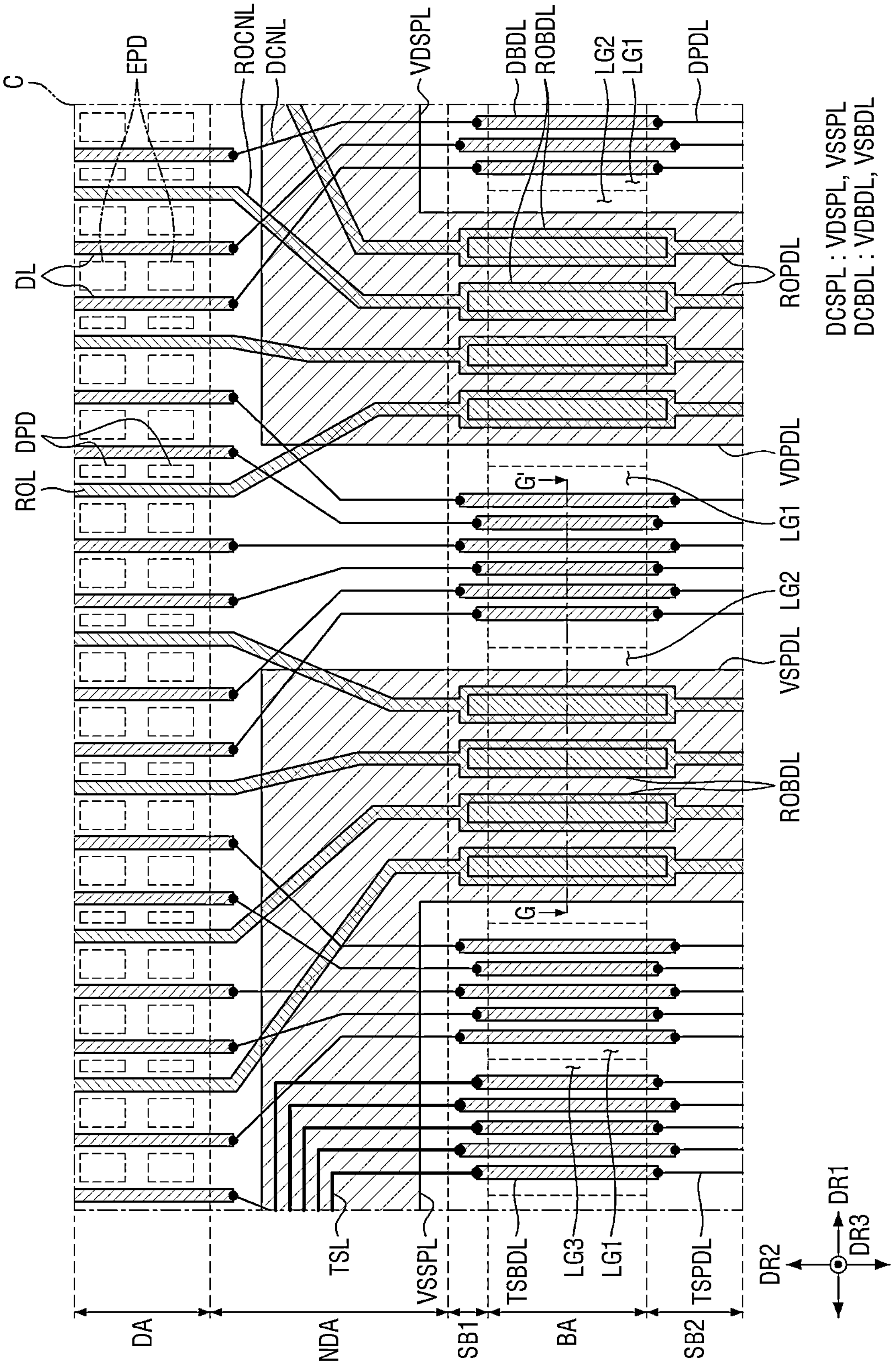
FIG. 20 is a plan view showing part C of FIG. 5 according to a fourth embodiment.
Figure 21:
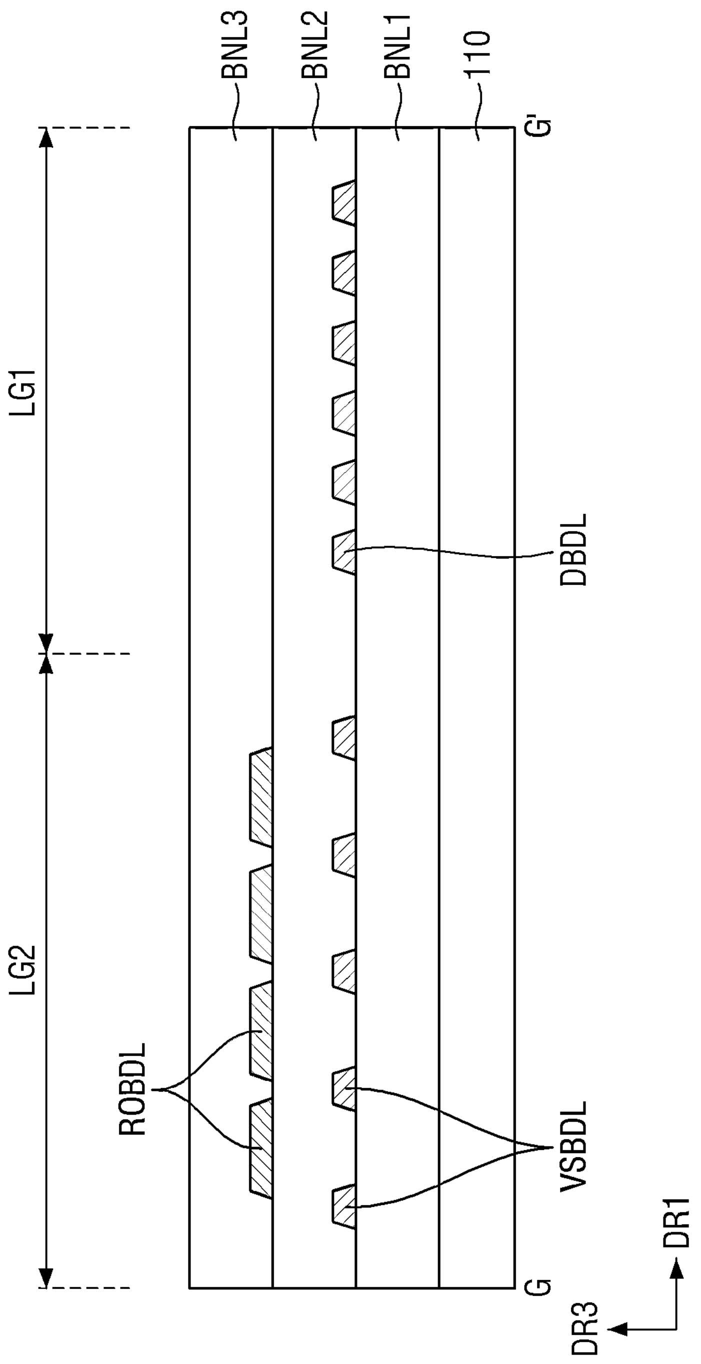
FIG. 21 is a cross-sectional view taken along line G-G' of FIG. 20.

FIG. 20 is a plan view showing part C of FIG. 5 according to a fourth embodiment. FIG. 21 is a cross-sectional view taken along line G-G' of FIG. 20.

Referring to FIGS. 20 and 21, the display device 100 according to the fourth embodiment is substantially the same as that of the first embodiment shown in FIGS. 14, 15, and 16, except that separation areas between the read-out bending lines ROBDL overlap the DC power bending lines DCBDL (e.g., VSBDL), and thus redundant description will be omitted below.

According to the fourth embodiment, one of the read-out bending lines ROBDL may overlap a separation area between two of the DC power bending lines DCBDL (e.g., VSBDL), and also overlap a part of each of the two DC power bending lines DCBDL (e.g., VSBDL).

In this way, a period during which the signals of the read-out bending lines ROBDL are maintained may be increased due to capacitance generated in the overlapping area between the read-out bending line ROBDL and the DC power bending line DCBDL (e.g., VSBDL). Accordingly, signal distortion in the read-out lines ROL may be reduced.

Figure 22:
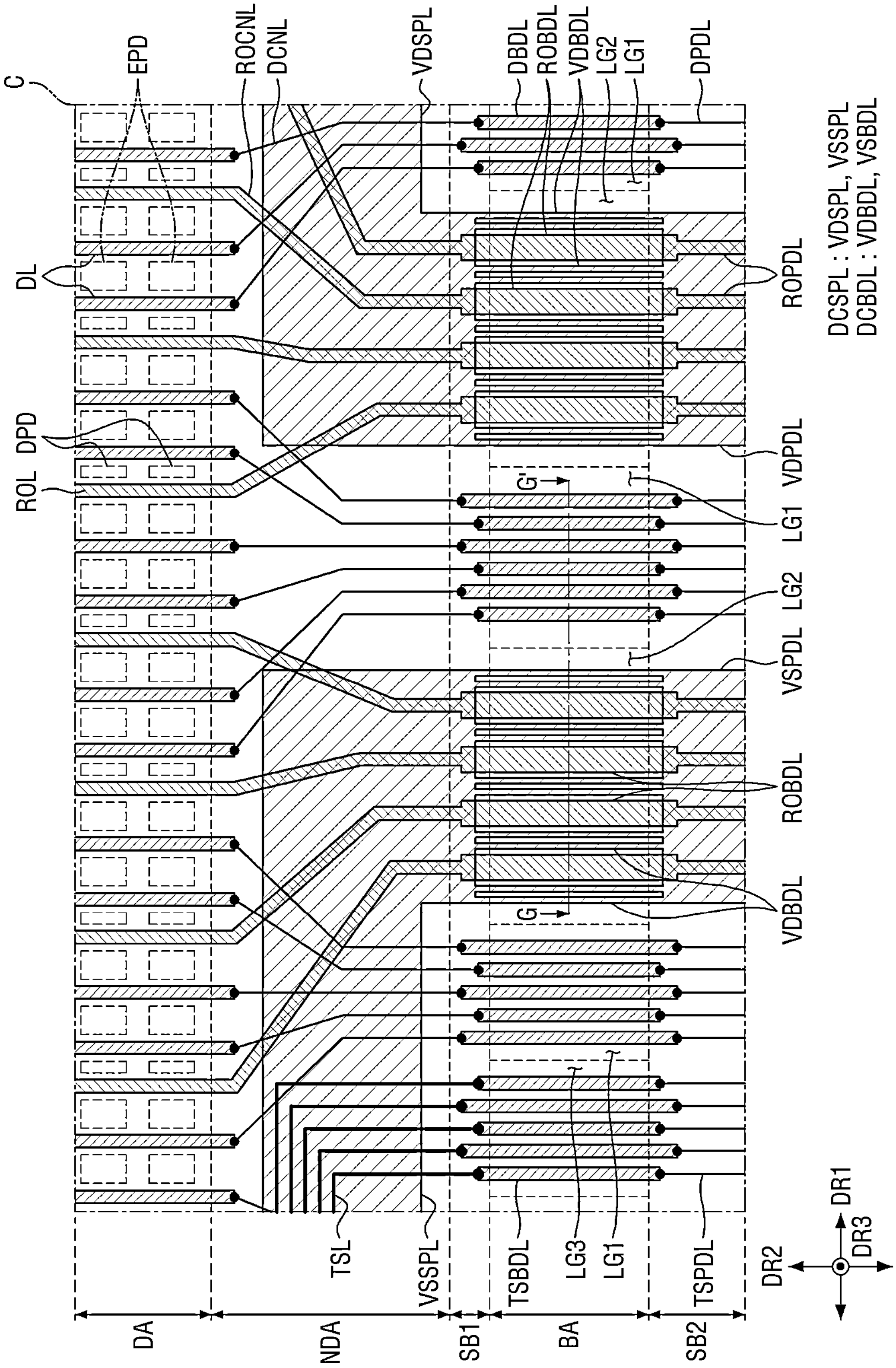
FIG. 22 is a plan view showing part C of FIG. 5 according to a fifth embodiment.
Figure 23:
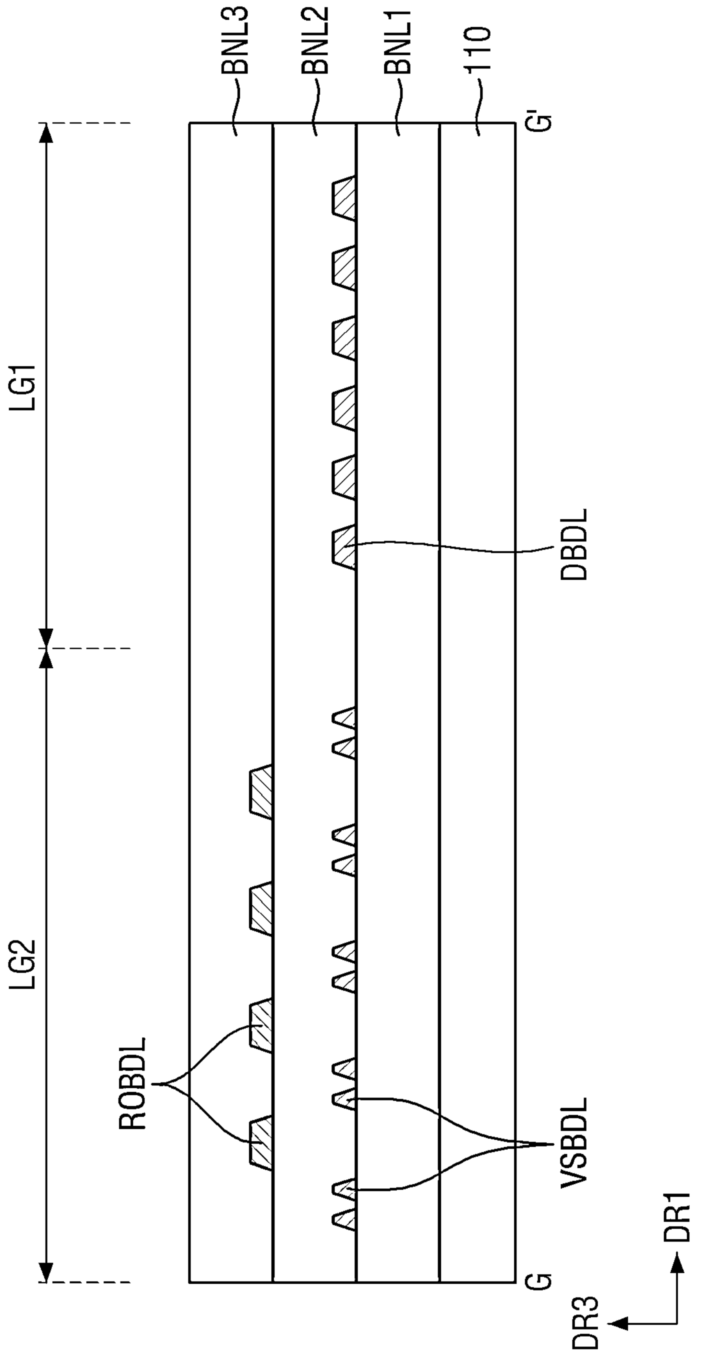
FIG. 23 is a cross-sectional view taken along line G-G' of FIG. 22.

FIG. 22 is a plan view showing part C of FIG. 5 according to a fifth embodiment. FIG. 23 is a cross-sectional view taken along line G-G' of FIG. 22.

Referring to FIGS. 22 and 23, the display device 100 according to the fifth embodiment is substantially the same as that of the first embodiment shown in FIGS. 14, 15, and 16, except that two or more of the DC power bending lines DCBDL (e.g., VSBDL) are disposed between the read-out bending lines ROBDL, and thus redundant description will be omitted below.

According to the fifth embodiment, this may be easily applied to the circuit layer 120 when the number of separation areas between the DC power bending lines DCBDL (e.g., VSBDL) is an integer multiple of the number of the read-out bending lines ROBDL.

Figure 24:
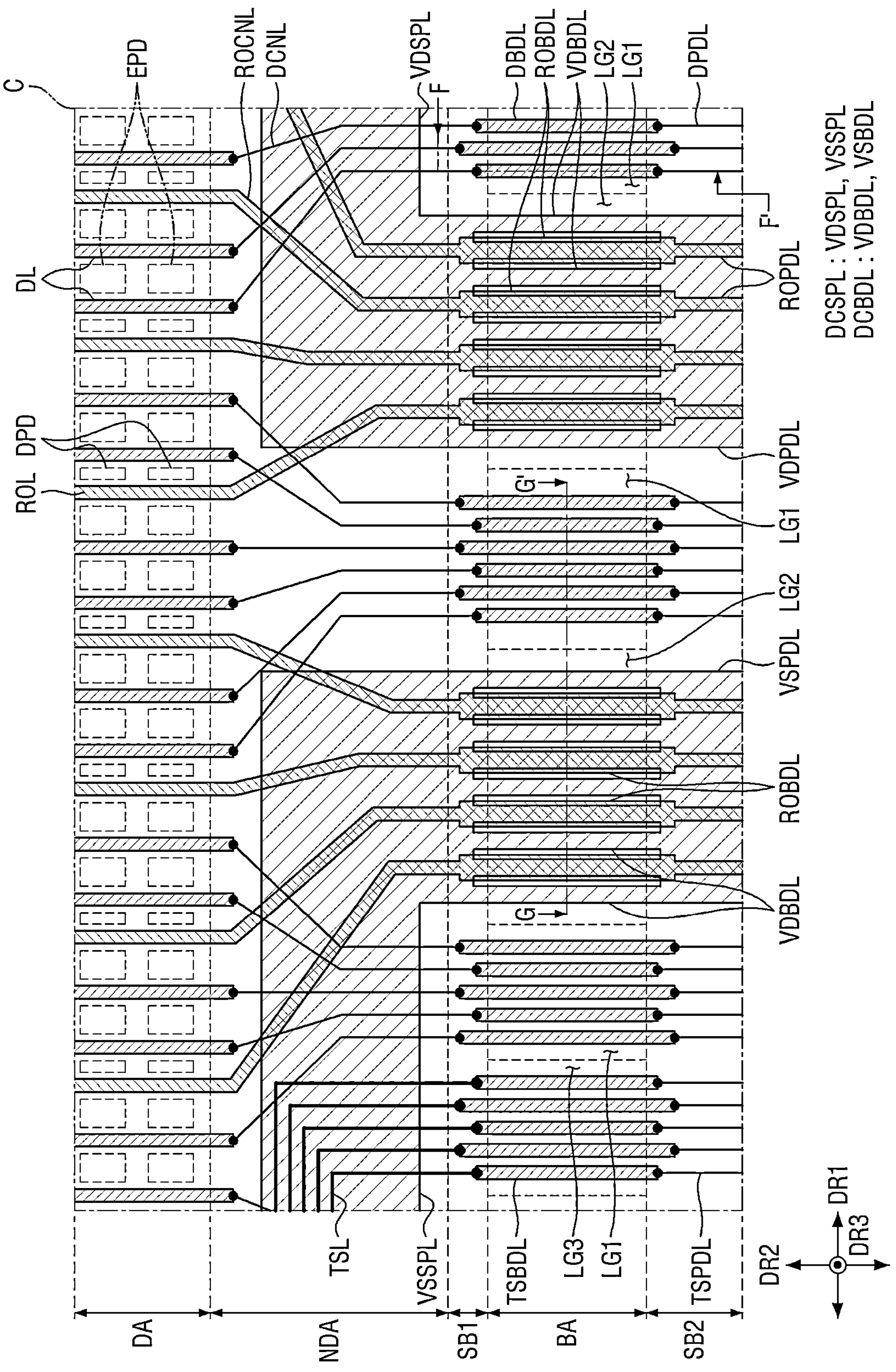
FIG. 24 is a plan view showing part C of FIG. 5 according to a sixth embodiment.
Figure 25:
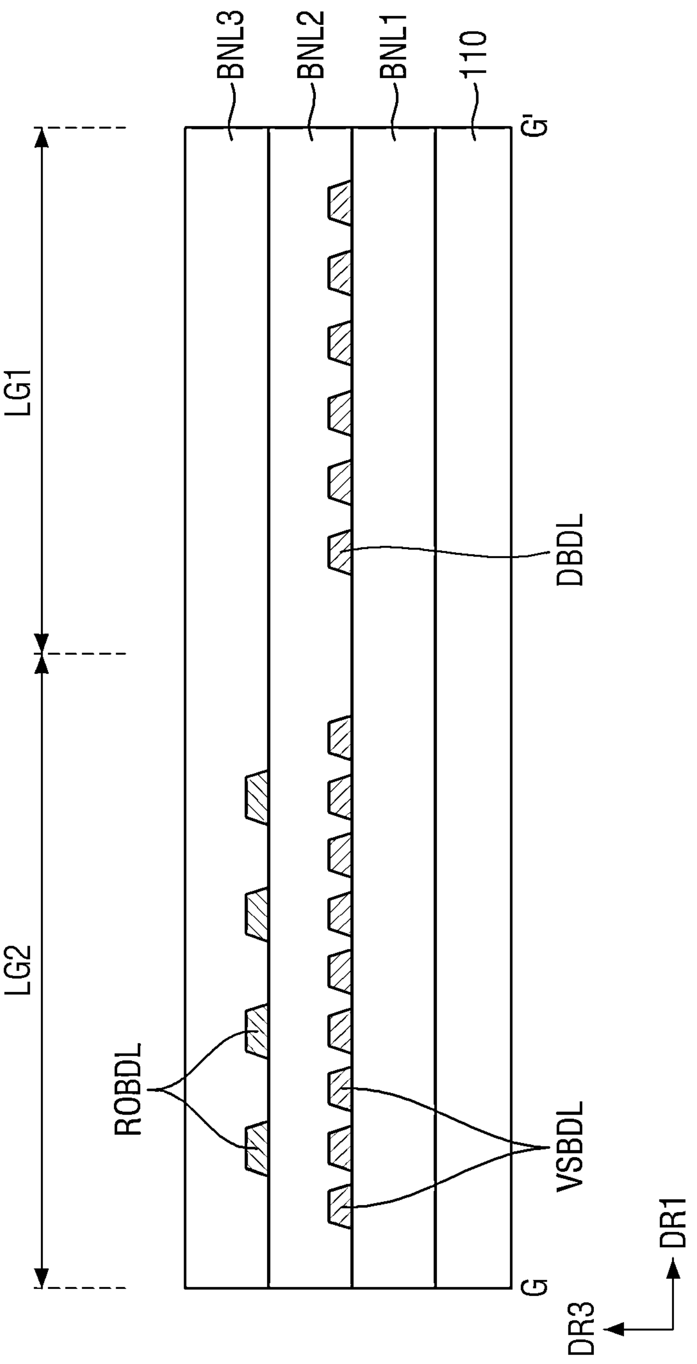
FIG. 25 is a cross-sectional view taken along line G-G' of FIG. 24 according to the sixth embodiment.
Figure 26:
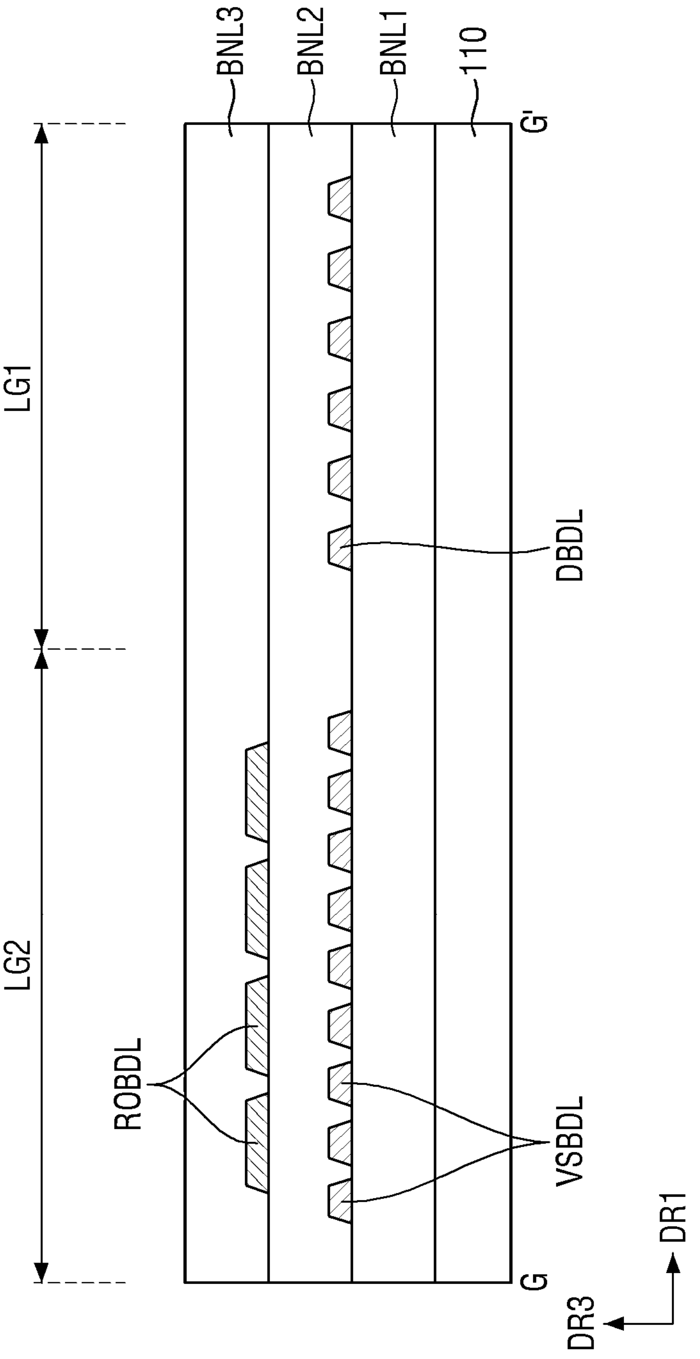
FIG. 26 is a cross-sectional view taken along line G-G' of FIG. 24 according to a seventh embodiment.

FIG. 24 is a plan view showing part C of FIG. 5 according to a sixth embodiment. FIG. 25 is a cross-sectional view taken along line G-G' of FIG. 24 according to the sixth embodiment. FIG. 26 is a cross-sectional view taken along line G-G' of FIG. 24 according to a seventh embodiment.

Referring to FIGS. 24 and 25, the display device 100 according to the sixth embodiment is substantially the same as that of the fourth embodiment shown in FIGS. 20 and 21, except that one of the read-out bending lines ROBDL overlaps at least one DC power bending line DCBDL (e.g., VSBDL) disposed between two of the DC power bending lines DCBDL (e.g., VSBDL), and thus redundant description will be omitted below.

Referring to FIG. 26, the display device 100 according to the seventh embodiment is substantially the same as that of the sixth embodiment shown in FIGS. 24 and 25, except that one of the read-out bending lines ROBDL overlaps not only at least one DC power bending line DCBDL (e.g., VSBDL) disposed between two of the DC power bending lines DCBDL (e.g., VSBDL) but also a part of each of the two DC power bending lines DCBDL (e.g., VSBDL), and thus redundant description will be omitted below.

According to the sixth and seventh embodiments, as the overlapping area between the read-out bending lines ROBDL and the DC power bending lines DCBDL (e.g., VSBDL) increases, the signal distortion of the read-out bending lines ROBDL may be reduced.

However, the effects of the present disclosure are not restricted to the one set forth herein. The above and other effects of the present disclosure will become more apparent to one of daily skill in the art to which the present disclosure pertains by referencing the claims.

What is claimed is:

1. A display device comprising:

a substrate including:

a main region including a display area in which light emitting elements and light sensing elements are disposed and a non-display area disposed around the display area, and a sub-region protruding from one side of the main region in which a bending region configured to be bent is disposed; and a circuit layer disposed on the substrate, wherein the circuit layer includes:

light emitting pixel drivers respectively electrically connected to the light emitting elements, light sensing pixel drivers respectively electrically connected to the light sensing elements, data lines electrically connected to the light emitting pixel drivers, the data lines including data line groups each including at least two data lines, and read-out lines electrically connected to the light sensing pixel drivers, the read-out lines including read-out line groups each including at least two read-out lines, and wherein read-out lines in one read-out line group disposed in the bending region are disposed adjacent to each other without a data line interposed between the adjacent read-out lines.

2. The display device of claim 1, wherein the read-out line groups and the data line groups are arranged side by side in a first direction intersecting a direction in which the sub-region extends from the main region, wherein the data lines and the read-out lines extend in a second direction in the bending region, and wherein the read-out line groups are spaced apart from the data line groups in the first direction.

3. The display device of claim 2, wherein the circuit layer further comprises:

DC power supply lines extending from the non-display area to the bending region, and wherein each of the read-out lines overlaps at least a portion of the DC power lines in the bending region in a plan view.

4. The display device of claim 3, wherein the data lines, the read-out lines, and the DC power lines include the same conductive layer, and wherein each of the read-out lines is disposed between the DC power lines in the bending region in a plan view.

5. The display device of claim 3, wherein the read-out lines are disposed on an insulating layer covering the data lines and the DC power lines.

6. The display device of claim 5, wherein each of the read-out lines is disposed between the DC power lines in the bending region in a plan view.

7. The display device of claim 5, wherein at least one of the DC power lines is disposed between the read-out lines in the bending region in a plan view.

8. The display device of claim 5, wherein separation areas disposed between the read-out lines overlap the DC power lines in the bending region in a plan view.

9. The display device of claim 8, wherein one of the read-out lines overlaps a separation area between two of the DC power lines and a portion of each of the two DC power lines in the bending region in a plan view.

10. The display device of claim 9, wherein each of the read-out lines further overlaps at least one DC power line disposed between the two DC power lines.

11. The display device of claim 3, wherein the circuit layer further comprises touch sensor lines disposed in the bending region, extending in the second direction, and respectively electrically connected to a touch sensor layer, the touch sensor lines including touch sensor line groups each including at least two touch sensor lines, and wherein the touch sensor line groups are arranged side by side with the data line groups and the read-out line groups.

12. The display device of claim 3, wherein the circuit layer comprises:

a first semiconductor layer disposed on the substrate;

a first inorganic insulating layer covering the first semiconductor layer;

a first conductive layer disposed on the first inorganic insulating layer;

a second inorganic insulating layer covering the first conductive layer;

a second conductive layer disposed on the second inorganic insulating layer;

a third inorganic insulating layer covering the second conductive layer;

a second semiconductor layer disposed on the third inorganic insulating layer;

a fourth inorganic insulating layer covering the second semiconductor layer;

a third conductive layer disposed on the fourth inorganic insulating layer;

a fifth inorganic insulating layer covering the third conductive layer;

a fourth conductive layer disposed on the fifth inorganic insulating layer;

a first planarization layer covering the fourth conductive layer;

a fifth conductive layer disposed on the first planarization layer;

a second planarization layer covering the fifth conductive layer;

a sixth conductive layer disposed on the second planarization layer; and a third planarization layer covering the sixth conductive layer, wherein the fifth conductive layer includes the data lines and the DC power supply lines, and wherein the read-out lines are disposed in the fifth conductive layer or the sixth conductive layer.

13. The display device of claim 12, further comprising:

a bending hole disposed in an area corresponding to the bending region and formed through the first inorganic insulating layer, the second inorganic insulating layer, the third inorganic insulating layer, the fourth inorganic insulating layer, and the fifth inorganic insulating layer; and a bank covering the bending hole, wherein the bank includes:

a first bank layer which is the same layer as the first planarization layer and covers the bending hole;

a second bank layer which is the same layer as the second planarization layer and covers the first bank layer; and a third bank layer which is the same layer as the third planarization layer and is disposed on the second bank layer, and wherein the data lines and the DC power supply lines are disposed on the first bank layer and covered with the second bank layer.

14. An electronic device comprising:

a display device configured to emit light for displaying an image; and a cover window and a bracket facing each other and configured to accommodate the display device, wherein the display device comprises:

a substrate comprising a main region comprising a display area in which emission areas are arranged and a non-display area disposed around the display area, and a sub-region protruding from one side of the main region;

a circuit layer disposed on the substrate;

an element layer disposed on the circuit layer;

an encapsulation layer disposed on the element layer; and a touch sensor layer disposed on the encapsulation layer, wherein the sub-region comprises a bending region which is configured to be bent, a first sub-region disposed between one side of the bending region and the main region, and a second sub-region connected to the other side of the bending region, wherein the display area further comprises light sensing areas disposed in portions of a non-emission area which is a separation area between the emission areas, wherein the element layer comprises light emitting elements respectively disposed in the emission areas and light sensing elements respectively disposed in the light sensing areas, wherein the circuit layer comprises:

light emitting pixel drivers respectively electrically connected to the light emitting elements, light sensing pixel drivers respectively electrically connected to the light sensing elements, data lines disposed in the display area and electrically connected to the light emitting pixel drivers, read-out lines disposed in the display area and electrically connected to the light sensing pixel drivers, data bending lines disposed in the bending region and respectively electrically connected to the data lines, read-out bending lines disposed in the bending region and respectively electrically connected to the read-out lines, and touch sensor bending lines disposed in the bending region, extending in the second direction, and respectively electrically connected to touch sensor lines of the touch sensor layer, and wherein the bending region comprises:

first wiring group areas in which at least two data bending lines are disposed, second wiring group areas in which at least two read-out bending lines disposed, and third wiring group areas in which at least two touch sensor bending lines are disposed.

15. The electronic device of claim 14, wherein the circuit layer further comprises:

DC power supply lines disposed in the non-display area and transmitting DC powers of different voltage levels; and DC power bending lines disposed in the bending region and respectively electrically connected to the DC power supply lines, wherein, in the second wiring group areas, two or more of the DC power bending lines are disposed, wherein the first wiring group areas, the second wiring group areas, and the third wiring group areas are arranged side by side in a first direction intersecting a direction in which the sub-region protrudes from the main region, wherein the data bending lines, the read-out bending lines, and the DC power bending lines extend in a second direction intersecting the first direction, disposed between the first sub-region and the second sub-region, wherein the read-out bending lines are spaced apart from the data bending lines in the first direction, and wherein each of the read-out bending lines overlaps at least a part of a separation area between the DC power bending lines.

16. The electronic device of claim 15, wherein the data bending lines, the read-out bending lines, and the DC power bending lines include the same conductive layer, and wherein each of the read-out bending lines is disposed between the DC power bending lines in a plan view.

17. The electronic device of claim 15, wherein the read-out bending lines are disposed on an insulating layer covering the data bending lines and the DC power bending lines.

18. The electronic device of claim 17, wherein each of the read-out bending lines is disposed between the DC power bending lines in a plan view.

19. The electronic device of claim 17, wherein separation areas between the read-out bending lines overlap the DC power bending lines, and wherein one of the read-out bending lines overlaps a separation area between two of the DC power bending lines, and a part of each of the two DC power bending lines.

20. The electronic device of claim 19, wherein each of the read-out bending lines further overlaps at least one DC power bending line disposed between the two DC power bending lines in a plan view.

* * * * *